(12) United States Patent
Saito

(10) Patent No.: US 6,795,025 B2
(45) Date of Patent: Sep. 21, 2004

(54) WIRELESS TAG, ITS MANUFACTURING AND ITS LAYOUT

(75) Inventor: Takeshi Saito, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 11 days.

(21) Appl. No.: 10/387,376

(22) Filed: Mar. 14, 2003

(65) Prior Publication Data

US 2003/0169204 A1 Sep. 11, 2003

Related U.S. Application Data

(63) Continuation of application No. 09/576,602, filed on May 24, 2000, now Pat. No. 6,563,463.

(30) Foreign Application Priority Data

May 24, 1999 (JP) .......................................... 11-142755

(51) Int. Cl.⁷ ................................................ H01Q 1/38
(52) U.S. Cl. ............................. 343/700 MS; 343/830
(58) Field of Search ......................... 343/700 MS, 829, 343/830, 848, 846, 905

(56) References Cited

U.S. PATENT DOCUMENTS

| | | |
|---|---|---|
| 4,386,357 A | 5/1983 | Patton |
| 4,529,987 A | 7/1985 | Bhartia et al. |
| 5,010,349 A | 4/1991 | Mizuno et al. |
| 5,061,939 A | 10/1991 | Nakase |
| 5,086,389 A * | 2/1992 | Hassett et al. ............... 364/401 |
| 5,561,435 A | 10/1996 | Nalbandian et al. |
| 5,682,167 A | 10/1997 | Mullen et al. |
| 5,694,135 A | 12/1997 | Dikun et al. |
| 5,872,542 A | 2/1999 | Simons et al. |
| 5,912,632 A * | 6/1999 | Dieska et al. .......... 340/825.54 |
| 6,034,636 A | 3/2000 | Saitoh |
| 6,049,309 A | 4/2000 | Timoshin et al. |
| 6,259,407 B1 | 7/2001 | Tran |
| 6,411,199 B1 * | 6/2002 | Geiszler et al. ............. 340/10.1 |

FOREIGN PATENT DOCUMENTS

| | | |
|---|---|---|
| JP | 8-185497 | 7/1996 |
| JP | 10-32214 | 2/1998 |

OTHER PUBLICATIONS

Shinichi Haruyama, "Technologies for microwave ID card system", the supplement of Japanese magazine "Transistor Gijutsu" published by CQ Publishing Co., Ltd., pp. 21–29, May 1992.

AIM Japan, "Technologies and applications for data carrier", published by The Nikkan Kogyo Shinbun, Ltd., pp. 22–25, Oct. 1990.

* cited by examiner

Primary Examiner—Shih-Chao Chen
(74) Attorney, Agent, or Firm—Antonelli, Terry, Stout & Kraus, LLP

(57) ABSTRACT

To provide a wireless tag having a wide band, a microstripline of a half wavelength type is used and an IC is built in between an antenna and a ground conductor, and a middle point of the antenna and the ground conductor are connected.

8 Claims, 40 Drawing Sheets

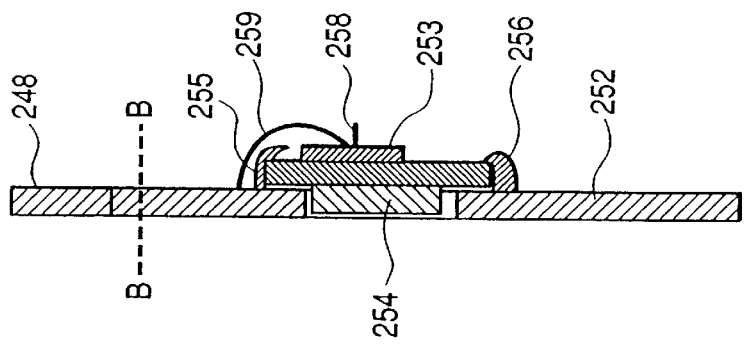
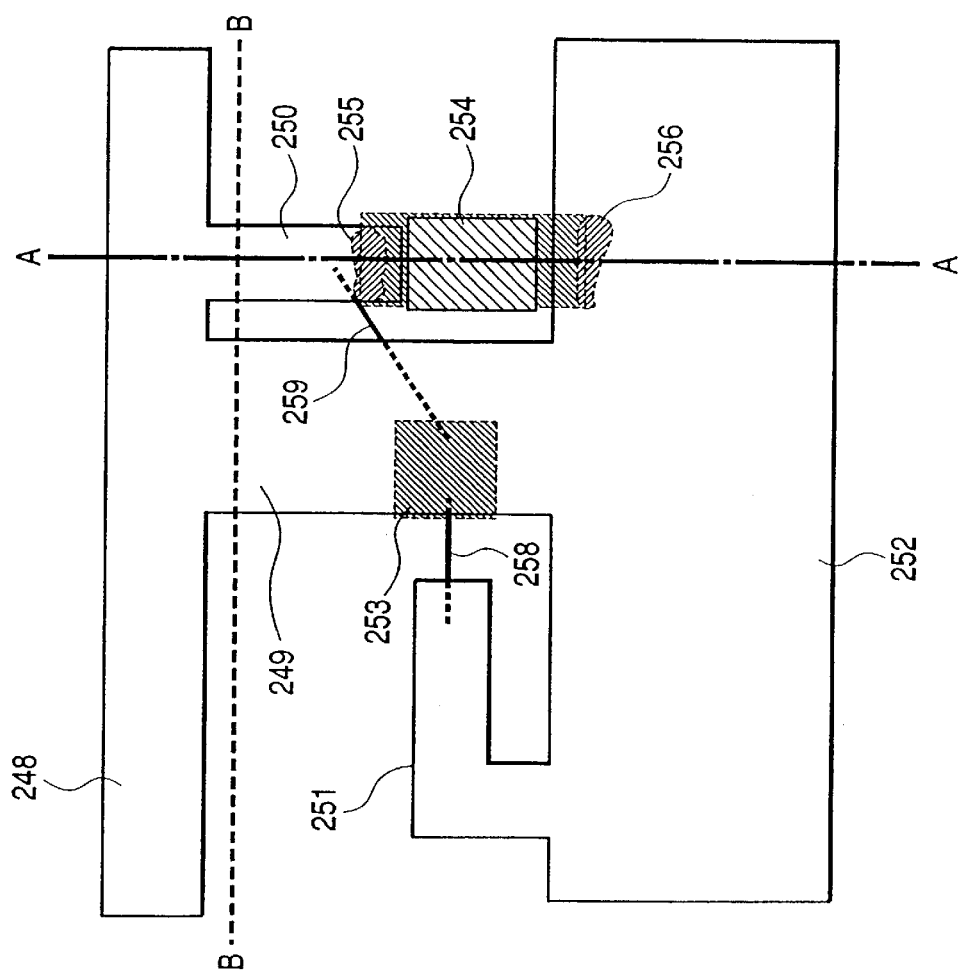

WIRELESS TAG, ITS MANUFACTURING AND ITS LAYOUT

CROSS REFERENCE TO RELATED APPLICATION

This is a continuation of U.S. application Ser. No. 09/576,602, filed May 24, 2000 now U.S. Pat. No. 6,563,463, the subject matter of which is incorporated by reference herein.

BACKGROUND OF THE INVENTION

The present invention relates to a wireless IC tag using a radio frequency of sub-microwave band and having no battery. A detailed description is given of a conventional wireless IC tag using the radio frequency band and having no battery in Shinichi Haruyama, "Technologies for microwave ID card system", the supplement of Japanese magazine "Transistor-Gijujtsu" published by CQ Publishing Co. Ltd., pp. 21–29, May 1992. In a rectenna (circuit comprising an antenna and a rectifying circuit) of a wireless IC tag described in the paper, there is introduced an antenna as shown by FIG. 1 comprising a series connection of a half-wavelength resonator and a shottky barrier diode. FIG. 1 shows the rectenna circuit, numerals 1 and 2 designate quarter-wavelength antennas, numeral 3 designates a shottky barrier diode, numerals 4 and 5 designate inductors, numeral 6 designates a condenser and numeral 7 designates an output terminal. Microwave power received by the ¼ wavelength type antennas 1 and 2 is rectified via the shottky barrier diode 3 and the inductor 5 and is accumulated in the capacitor 6 as direct current and is outputted from the output terminal 7 as necessary. Further, there is described an example of utilizing a rectangular microstrip-patch antenna in AIM Japan, "Technologies and applications for data carrier" published by THE NIKKAN KOGYO SHIMBUN, LTD. pp. 22–25, October 1990. FIGS. 2A, 2B and 2C show the example of the rectangular microstrip-patch antenna in which FIG. 2A is a plane view, FIG. 2B is a side view and FIG. 2C shows a rear face. In FIGS. 2A, 2B, 2C, numeral 8 designates a rectangular patch, numeral 9 designates a dielectric member, numeral 10 designates a ground conductor, numeral 11 designates a feed line and numeral 12 designates a feed point. A microwave signal inputted from the feed line 11 is resonated at a frequency determined by a length "l" of a side of a square shape including the feed point 12 of the rectangular patch 8. According to these antennas, when the losses of the member is reduced to reduce loss of the antenna, the Q of the resonating circuit becomes high and a matching frequency band is narrowed. When the Q of the resonator is increased, it is difficult to widen the matching frequency band of the antenna.

According to a wireless IC tag, voltage generated by rectifying current is changed in accordance with a distance between the wireless IC tag and an interrogator antenna and when the wireless IC tag becomes proximate to the interrogator antenna, the rectifying voltage is rapidly elevated. Therefore, in view of the withstanding voltage of an IC, a voltage value is devised to be maintained at a predetermined value or lower by a voltage limiter comprising transistors connected in multiple stages in Japanese Laid-open Patent (Kokai) No. Hei 8-185497. Further, a result of communicating with the wireless IC tag is produced by data of the wireless IC tag absorbed from the interrogator.

With regard to a structure of a dipole antenna for electrically connecting and packaging an antenna of a wireless IC tag and an IC circuit, in "manufacturing method for wireless tag" disclosed in Japanese Laid-open Patent (Kokai) No. Hei 10-32214, there is described a method of mounting a structure in which an IC is attached to a strip-like antenna having a lead frame structure and an IC attaching portion thereof or a total thereof including the antenna is integrated by a mold technology such as transfer molding.

SUMMARY OF THE INVENTION

According to the conventional technologies, it has been difficult to widen a matching frequency band by promoting a sensitivity of the antenna of the wireless IC tag. It is an object of the present invention to achieve wide band formation without deteriorating the sensitivity of an antenna to thereby facilitate to manufacture the antenna by promoting the yield against the manufacturing dispersion by constituting the wide band formation of the antenna.

It is another object of the present invention to realize a circuit constitution in place of a low voltage circuit maintained at predetermined voltage by wastefully consuming current by using a transistor, a zenner diode or the like, for carrying out operation of confirming transmittance of data between a wireless IC tag and an interrogator by using power dissipated in the previous low voltage circuit without checking and determining by the data of the wireless IC tag read by the interrogator. It is another object of the present invention to manufacture of a wireless IC tag of an integrated type by filling and molding a mold material of a transfer mold or the like as a dielectric material of an antenna in a microstrip-line constitution while ensuring electric connection between IC and the antenna and ensuring also mechanical strength in the antenna for the wireless IC tag in the microstrip structure comprising a ground conductor plate constituted by a lead frame and an antenna conductor.

In order to widen a matching frequency band without deteriorating the sensitivity of an antenna of a wireless IC tag, there is achieved wide band formation by double tuning by constituting an antenna of a double tuned type in which quarter-wavelength antenna resonators in a microstrip constitution are subjected to mutual inductance coupling by an impedance element comprising a common inductor. For that purpose, there is adopted an antenna structure for grounding a middle point of a half-wavelength antenna by using a through hole conductor with a ground face of a microstrip substrate or a lead frame conductor. There is constructed an integrated structure by mechanically and/or electrically connecting IC to a surface of an antenna constituted by a lead frame conductor on a side of a ground face by using an insulating adhering agent or a conductive adhering agent and pressurizing and solidifying a mold member for transfer mold of the lead frame integrally connected electrically and mechanically to a ground conductor constituted by the lead frame conductor by a conductor for grounding at a middle point of the antenna.

In order to make the rectified voltage generated at the rectenna circuit a constant voltage, according to the present invention, an LED (Light Emitting Diode) is introduced, and constant voltage formation of the circuit is achieved by utilizing the rapid rise of the forward direction voltage of the positive characteristic of the LED. Generated power increased as the wireless IC tag becomes proximate to an antenna of an interrogator, brings about an increase in current in the forward direction of the LED, increases light emitting intensity of the LED and the circuit maintains voltage applied on an IC circuit constituted by CMOS or the like at a predetermined value. The light emitting phenomenon at this occasion indicates that the interrogator makes access to the wireless IC tag or can make access thereto. At this occasion, the IC indicates a drivable state or a driving state and constitutes a criterion of in-operation of recognizing the wireless IC tag or finish of operation by a congestion control. Further, by setting and disposing a logic circuit in the IC circuit, the logic circuit can be used in various signals for positively controlling the light emitting state of the diode and knowing the state of the wireless IC tag via the logic circuit.

By press forming of a lead frame flat plate, the lead frame flat plate is formed in a shape of a cross having a connection conductor with a ground conductor at a middle point portion of a half-wavelength antenna formed in a short strip further formed with a connecting portion for connecting to match with the IC circuit between a middle point of any of the sides and an opening end of the antenna in the longitudinal direction of the antenna, further connected with a circuit of the wireless IC tag or a terminal for inputting/outputting signal of IC arranged at the middle point portion of the antenna by a technology of wire bonding or the like and at the same time, by connecting the circuit of the wireless IC tag or the ground terminal of the IC to the antenna conductor by the technology of wire bonding, the antenna portion is formed. From the lead frame flat plate constituting the ground conductor of the antenna of the microstrip-line formed by the same lead frame flat plate, there is formed a ground conductor portion in a shape of a box having an area wider than the face of the antenna and a shallow depth by a hexahedron structure one face of which is opened and which is press formed and the ground conductive portion is mechanically and electrically connected thereto at a connecting conductive portion of the ground conductor of the antenna portion such that the circuit or the IC of the wireless IC tag constitutes a face on the side of the ground conductor and such that the antenna portion and the ground conductive portion are kept in parallel with each other and a mold material used in transfermolding or the like is filled in a gap of parallel portions of the antenna and the ground conductor portion and the total is formed integrally.

Further, the wireless tag constituted by the microstrip-line receives radio waves from the antenna side and accordingly, the ground conductor on the rear face may be arranged to be opposed to the radio wave radiating side. Therefore, in the case in which the wireless tag is arranged to a distributed article or the like, the ground conductor side may constitute an adhering face.

These and other objects and many of the attendant advantages of the invention will be readily appreciated as the same becomes better understood by reference to the following detailed description when considered in connection with the accompanying drawings.

BRIEF DESCRIPTION OF THE DRAWINGS

FIG. 47A is a plane view of an LED mounting structure of the constant voltage type/light emitting type wireless tag according to the thirty-fifth embodiment; and FIG. 47B is a side view of the LED mounting structure of the constant voltage type/light emitting type wireless tag according to the thirty-fifth embodiment.

DETAILED DESCRIPTION OF THE PREFERRED EMBODIMENTS

Figure 1:
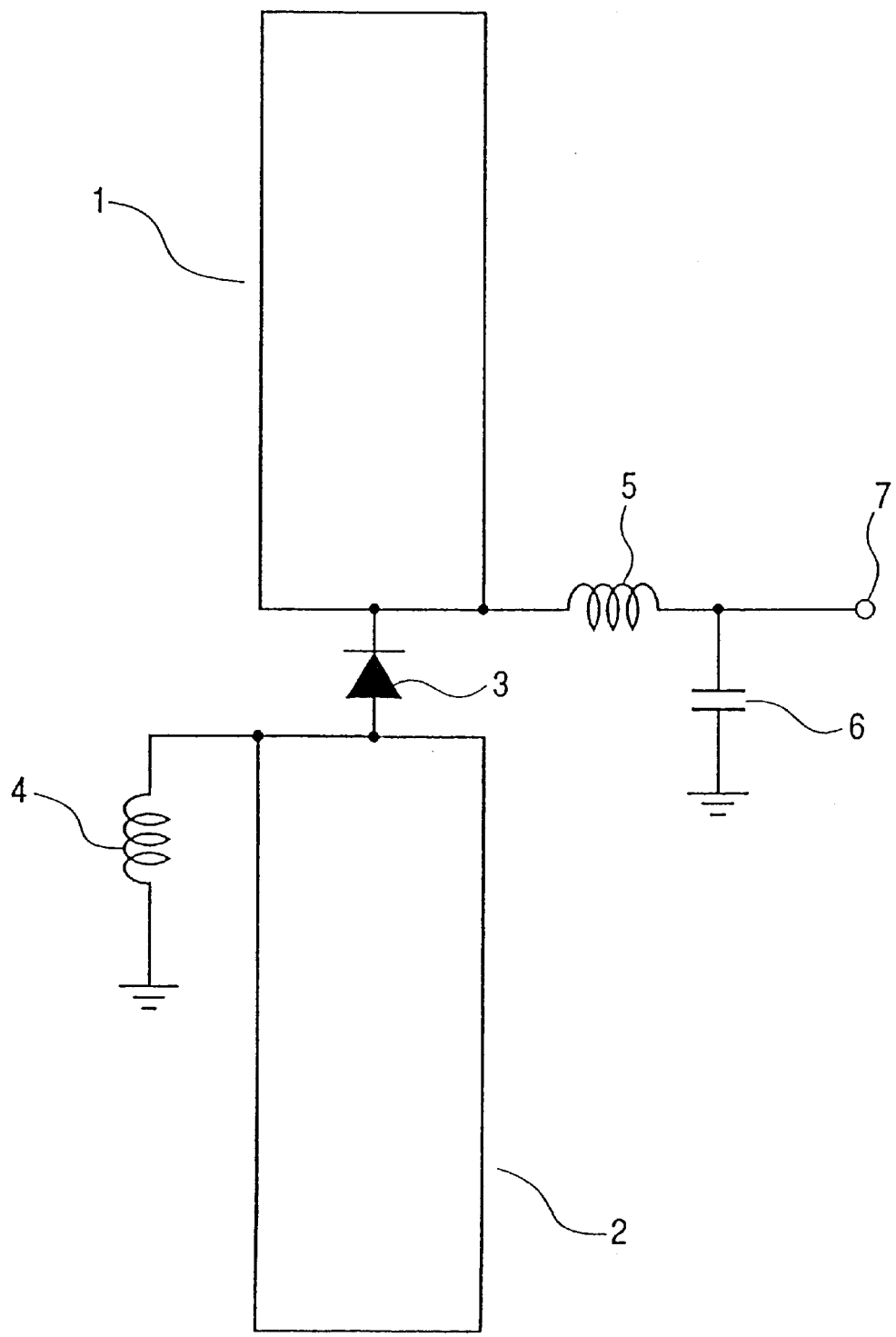
FIG. 1 shows a conventional example of a rectenna of a tag.
Figure 2A:
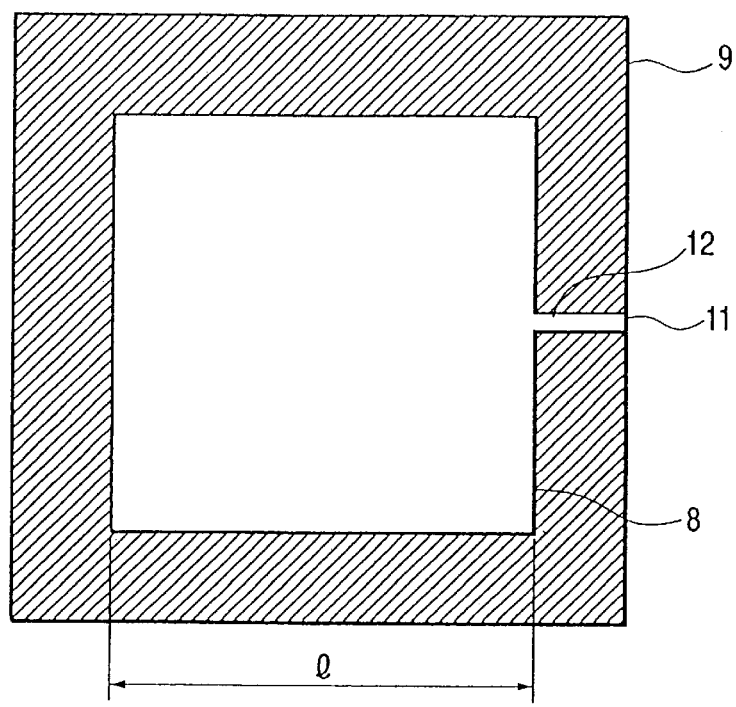
FIG. 2A is a plane view of an example of a patch antenna using a microstrip-line.
Figure 2B:
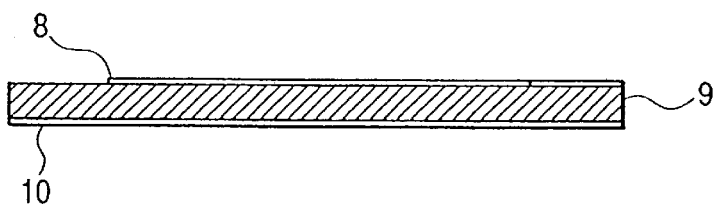
FIG. 2B is a side view of the example of the patch antenna using the microstrip-line.
Figure 2C:
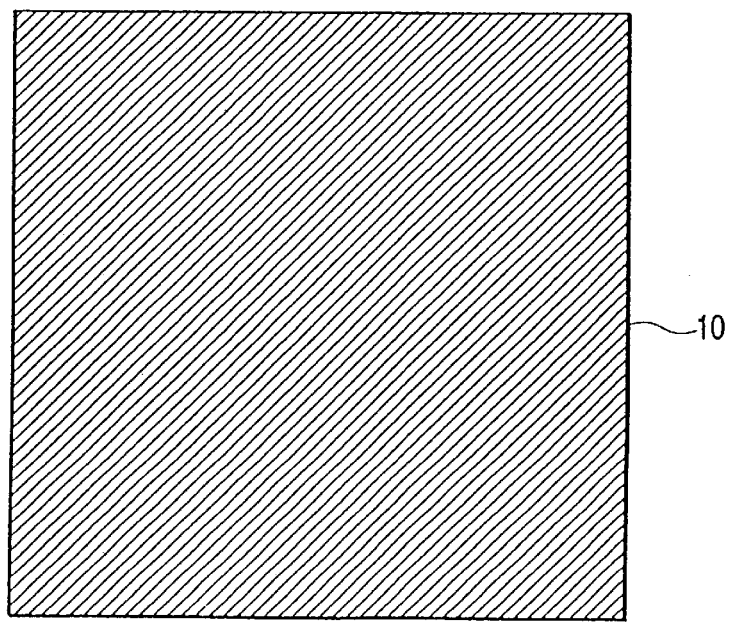
FIG. 2C is a rear view of the example of the patch antenna using the microstrip-line.
Figure 3A:
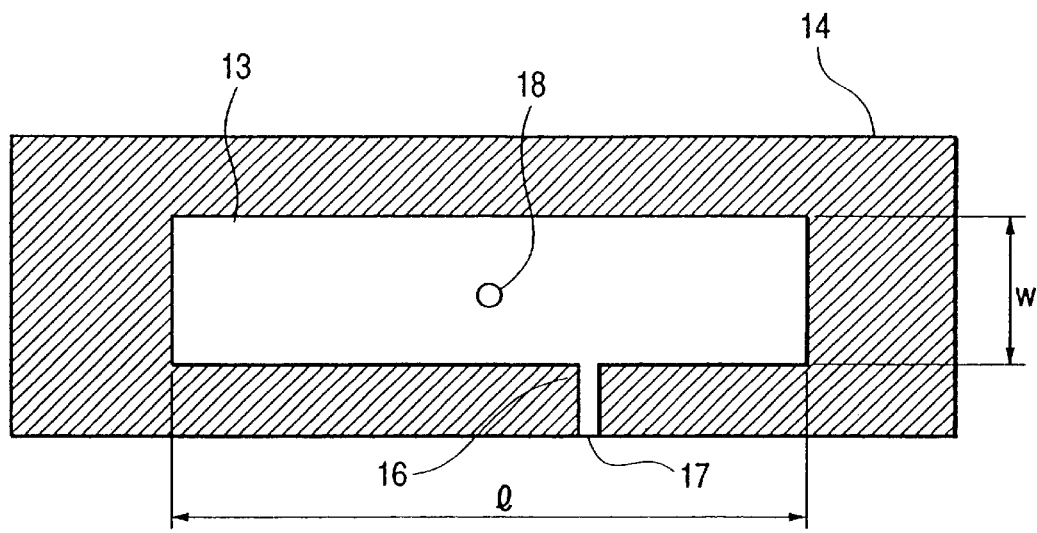
FIG. 3A is a plane view of a surface of an antenna of a wireless tag using a microstrip-line according to a first embodiment.
Figure 3B:
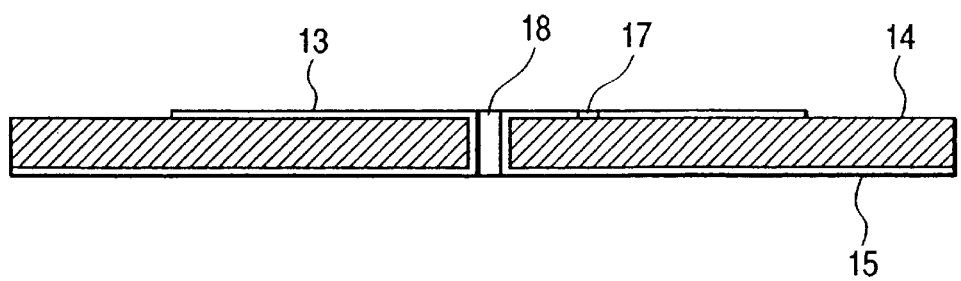
FIG. 3B is a sectional view of a side face of the antenna of the wireless tag using the microstrip-line according to the first embodiment.
Figure 3C:
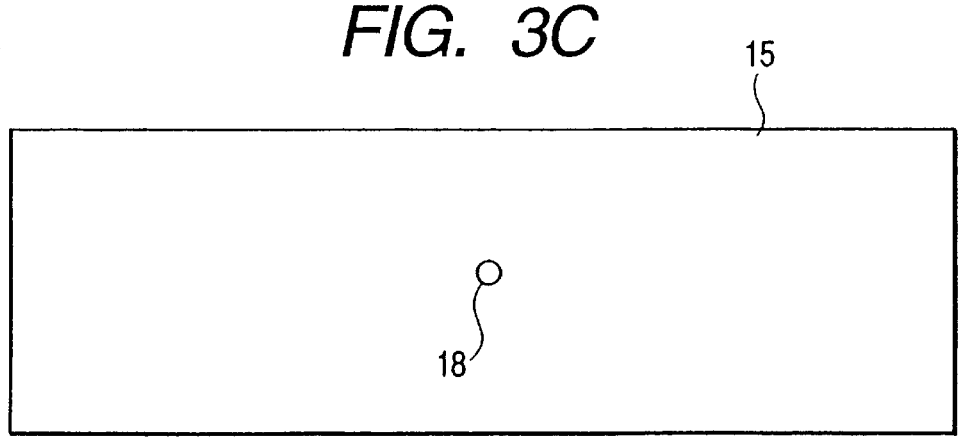
FIG. 3C is a sectional view of a rear face of the antenna of the wireless tag using the microstrip-line according to the first embodiment.

FIGS. 3A, 3B, 3C are view showing a constitution of a half wavelength type antenna constituted by a microstripline showing a first embodiment of the present invention in which FIG. 3A is a plane view of a surface thereof, FIG. 3B is a sectional view of a side place thereof and FIG. 3C is a plane view of a rear face thereof. In FIGS. 3A, 3B, 3C,— numeral 13 designates an antenna conductor, numeral 14 designates a dielectric member, numeral 15 designates a ground conductor, numeral 16 designates a feed point, numeral 17 designates an input/output terminal of signal and numeral 18 designates a through hole.

In FIGS. 3A, 3B, 3C, a length "l" of the antenna conductor 13 is set to a length in correspondence with a half wavelength at an operational frequency. A width "w" of the antenna conductor 13 is a parameter for setting the radiation efficiency of the antenna. The through hole 18 corresponds to substantially a middle point of the antenna conductor 13 and is electrically connected to the ground conductor at the rear face. A rectifying circuit portion of the rectenna is connected to the signal input/output terminal 17 and a signal is inputted to the antenna conductor 13 from the feed point.

Figure 4:
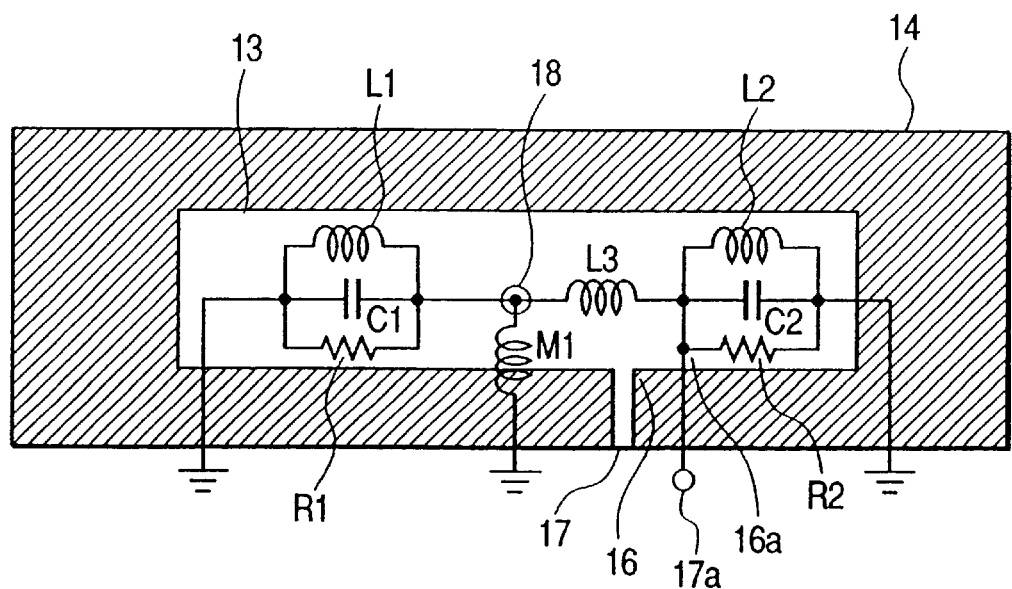
FIG. 4 is an equivalent circuit of the antenna according to the first embodiment.

FIG. 4 shows an equivalent circuit of the antenna shown by FIGS. 3A, 3B, 3C. In FIG. 4, an element which operates in the same fashion as that in the plane view of FIG. 3A has the same numerical designation and an explanation thereof will be omitted. Length portions on the left and on the right of the through hole 18 at the middle point of the half wavelength type antenna conductor 13 respectively constitute resonators each having a length of a quarter wavelength and respectively represented by resonators comprising parallel circuits of an inductor L1, a capacitor C1 and a resistor R1 as well as an inductor L2, a capacitor C2 and a resistor R2. The resonator on the right-side is connected to the resonator on the left side via an inductor L3 and is grounded via an inductor MI. The resonator on the right side is connected to the rectifying circuit portion of the rectenna at a signal input/output terminal 17a with a point of connecting the parallel resonating circuit and the inductor L3 as a feed point 16a. The circuit of FIG. 4 constitutes a double tuned circuit in which the left and right resonating circuits are coupled by the inductor MI. According to the double tuned circuit, it is known that in comparison with a single tuned circuit, the matching frequency band is widened and there will be constructed a constitution of an optimized resonant circuit absorbing a dispersion of a manufacturing dispersion or the like and suitable for a case of ensuring a function thereof and a case in which a using frequency band is wide.

Figure 5A:
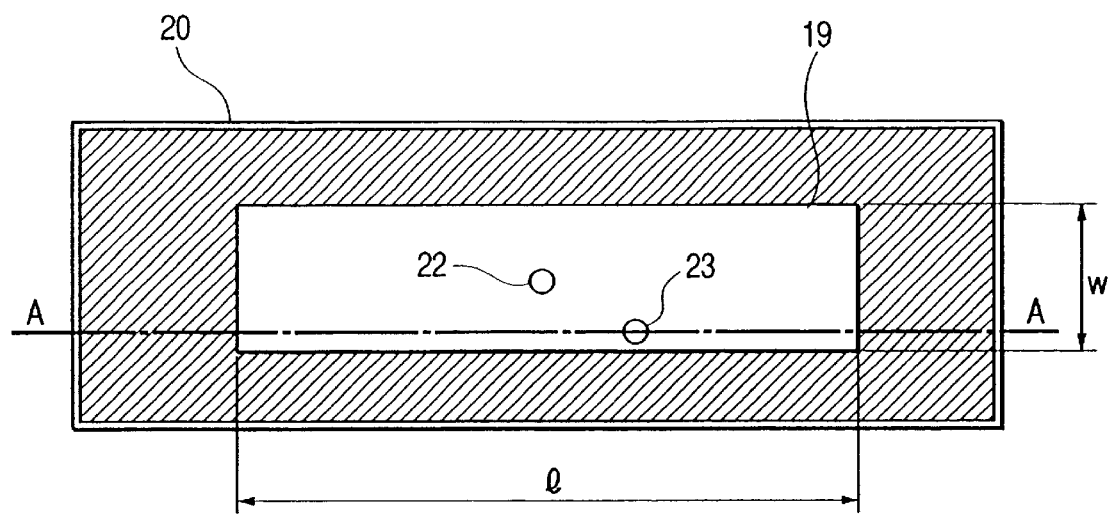
FIG. 5A is a plane view of an antenna for a wireless tag according to a second embodiment.
Figure 5B:
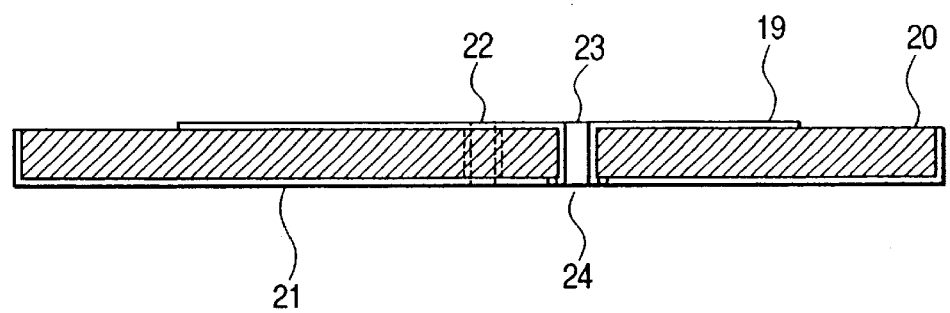
FIG. 5B is a sectional view of a side face of the antenna for the wireless tag according to the second embodiment.
Figure 5C:
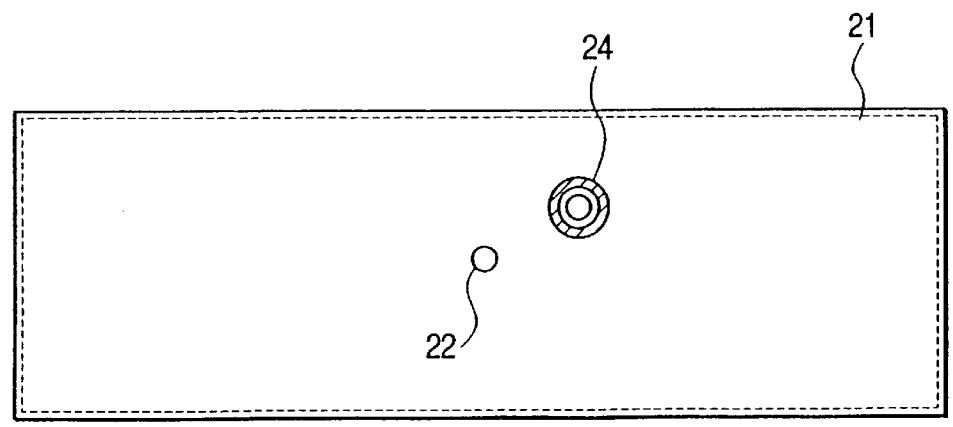
FIG. 5C is a plane view of a rear face of the antenna for the wireless tag according to the second embodiment.

FIGS. 5A, 5B and 5C are constitution views of an antenna comprising a microstrip-line showing a second embodiment of the present invention in which FIG. 5A is a plane view, FIG. 5B is a sectional view of a side face along a line A—A of FIG. 5A and FIG. 5C is a plane view of rear face thereof. In FIGS. 5A, 5B and 5C, numeral 19 designates an antenna conductor, numeral 20 designates a dielectric member, numeral 21 designates a ground conductor, numeral 22 designates a through hole, numeral 23 designates a feed point and numeral 24 designates a signal input/output terminal. A point of the embodiment which is different from the first embodiment in view of the constitution resides in that in the feed point 23 and the signal input/output terminal 24, the signal input/output terminal 24 is formed on the rear face of the dielectric member plate 20 by using a through hole. The rectifying circuit portion of the rectenna circuit can be arranged on the side of the ground conductor plate of the rear face. With regard to the width "w" and the length "l" of the antenna conductor 19, these are operated similar to those in FIGS. 3A, 3B and 3C.

Figure 6:
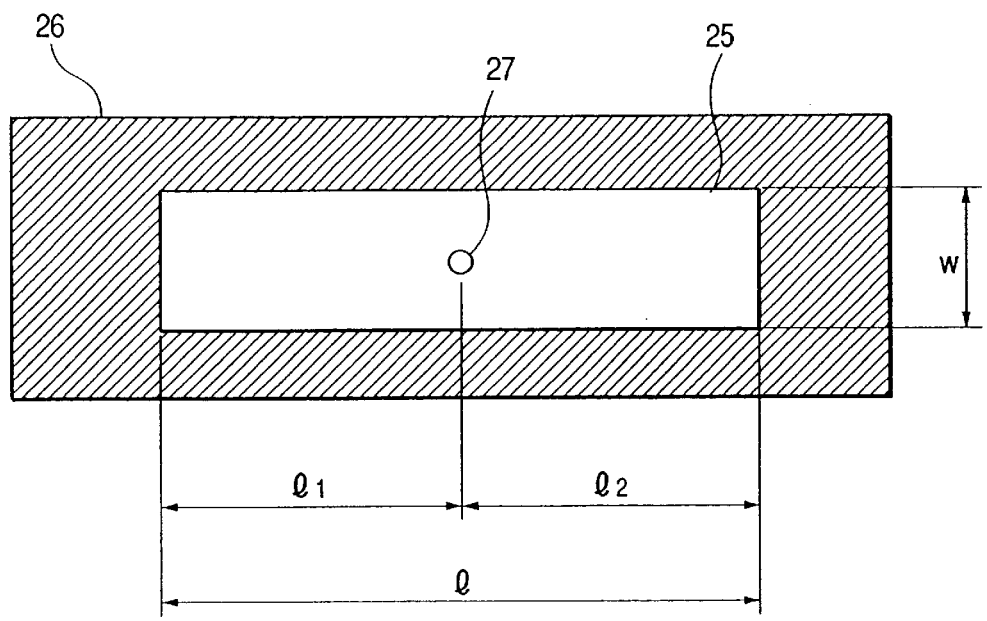
FIG. 6 shows a constitution of an antenna for a wireless tag according to a third embodiment.

A plane view of a surface of a half wavelength type antenna shown by FIG. 6 is a drawing showing a third embodiment of the present invention, numeral 25 designates an antenna conductor, numeral 26 designates a dielectric member and numeral 27 designates a through hole. A call signal input/output terminal and a feed line of power feed are omitted. Although omitted in the drawing, a ground conductor plate arranged on a rear face of the dielectric member 26 is constituted by a microstrip-line. By setting distances l1 and l2 from the through hole 27 connected to the ground conductor of the antenna conductor 25 to open ends to different values, an antenna can be constructed which resonates at two different frequencies. This is effective in the case in which—the frequency band is intended to widen and the case of constituting an antenna functioning at two different frequencies in correspondence with a quarter wavelength although the sensitivity of the antenna is more or less reduced. Operation of the width "w" of the antenna conductor 25 here is similar to those in the previous examples.

Figure 7:
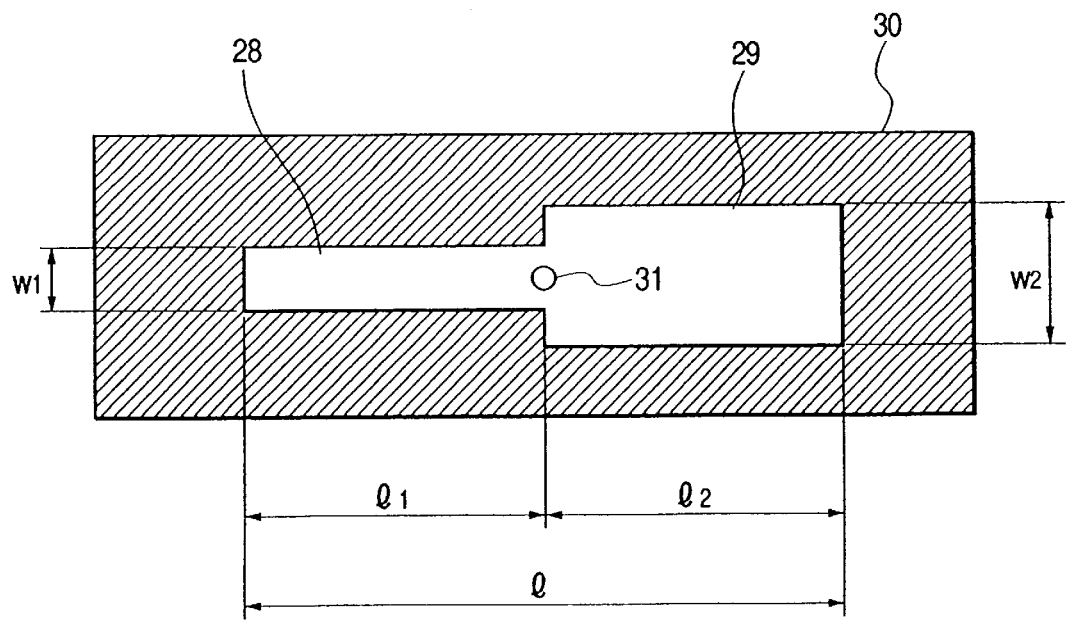
FIG. 7 shows a constitution of an antenna for a wireless tag according to a fourth embodiment.

FIG. 7 is a plane view of a surface of a half wavelength type antenna having a microstrip constitution showing a fourth embodiment of the present invention. In FIG. 7, numeral 28 designates a first quarter-wavelength resonator, numeral 29 designates a second quarter-wavelength resonator, numeral 30 designates a dielectric member and numeral 31 designates a through hole. A feed point, an input/output terminal of signal and a feed line are omitted. A point of the embodiment different from the third embodiment of FIG. 6 resides in constituting the resonator constituting the antenna by the through hole 31 connected to a ground conductor at a rear face omitted in the drawing, by the first quarter-wavelength resonator 28 and the second quarter-wavelength resonator 29 and in that lengths of lines of the first quarter-wavelength resonator and the second quarter-wavelength resonator are respectively different from l1, l2 and w1, w2. Two antennas can be realized simultaneously, the antennas respectively having different Q values and frequencies of quarterwave length resonators.

Figure 8A:
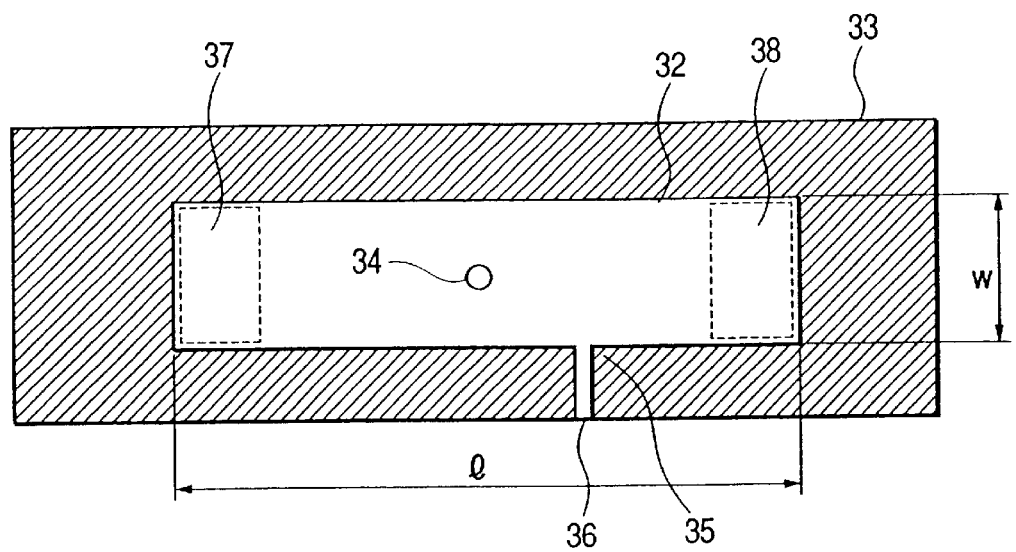
FIG. 8A is a plane view of an antenna face of an antenna for a wireless tag according to a fifth embodiment.
Figure 8B:
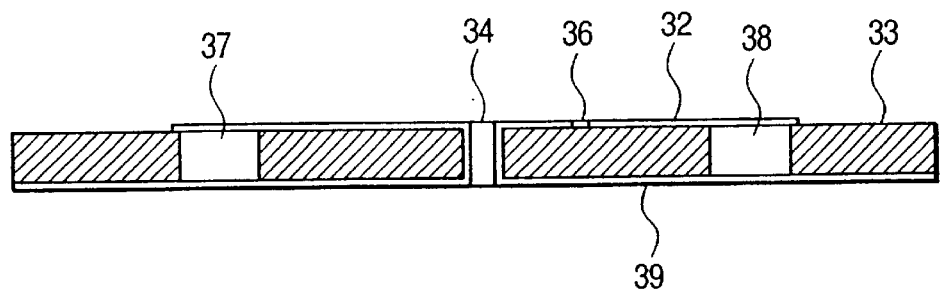
FIG. 8B is a sectional view of a side face of the antenna for the wireless tag according to the fifth embodiment.
Figure 8C:
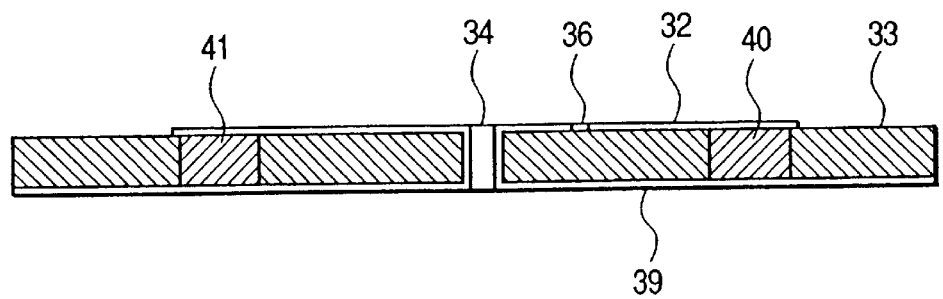
FIG. 8C is a sectional view of a side face of the antenna for the wireless tag according to the fifth embodiment.
Figure 9A:
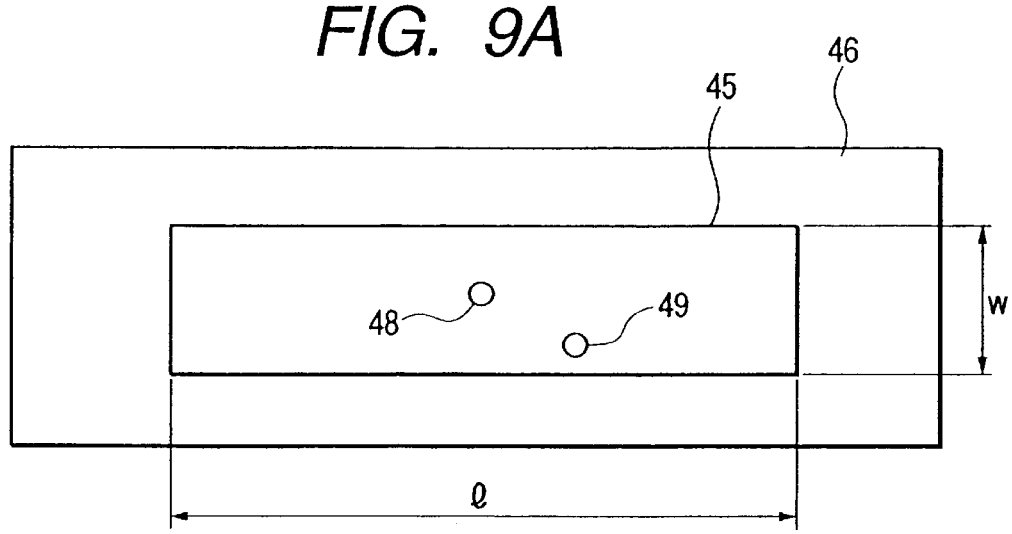
FIG. 9A is a plane view of an antenna for a wireless tag according to a sixth embodiment.
Figure 9B:
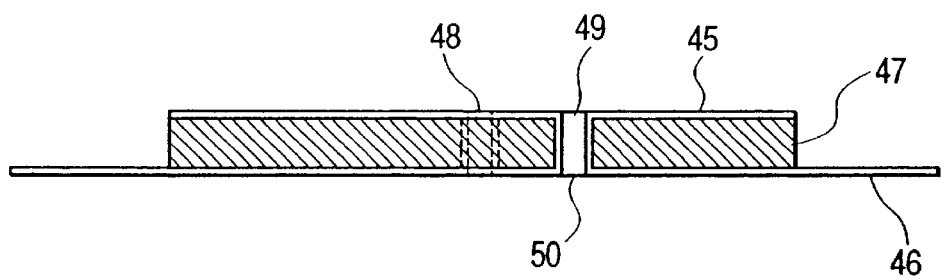
FIG. 9B is a sectional view of a side face of the antenna for the-wireless tag according to the sixth embodiment.
Figure 9C:
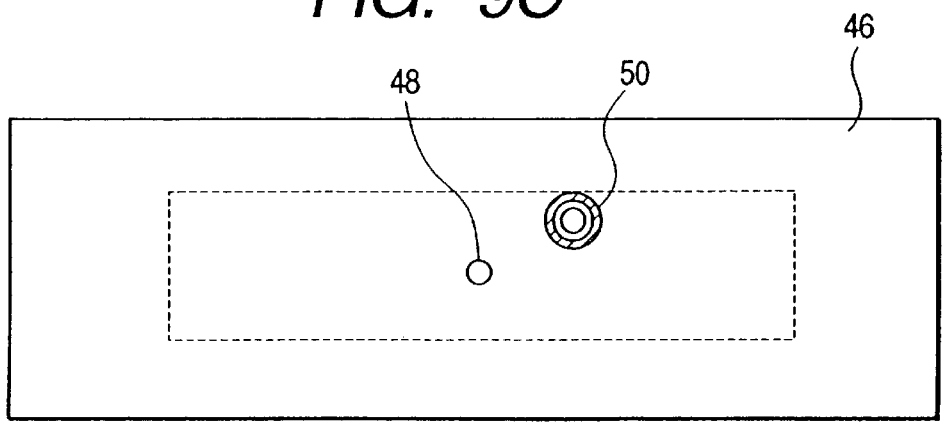
FIG. 9C is a plane view of a rear face of the antenna for the wireless tag according to the sixth embodiment.

FIGS. 8A, 8B and 8C are drawings of a half wavelength type antenna having a microstrip constitution showing a fifth embodiment in which FIG. 8A is a plane view of an antenna face of the antenna, FIGS. 8B and 8C are sectional views of side face thereof. In FIGS. 8A, 8B and 8C, numeral 32 designates an antenna conductor, numeral 33 designates a first dielectric member, numeral 34 designates a through hole, numeral 35 designates a feed point, numeral 36 designates a signal input/output terminal, numerals 37 and 38 designate cavities, numeral 39 designates a ground conductor, numeral 40 designates a second dielectric member and numeral 41 designates a third dielectric member. A point thereof different from FIGS. 3A, 3B and 3C showing the first embodiment resides in forming the cavities 37 and 38 by notching portions of the dielectric member 33 between the antenna conductor 32 and the ground conductor 39 and in replacing portions of the dielectric member plate 39 by the second dielectric member 40 and the third dielectric member 41 having different material. The material of the dielectric member between the antenna pattern 32 and the earth conductor 39 of the antenna having the microstrip-line constitution, is closely related to the frequency and the sensitivity and is effective in changing the antenna characteristic. FIGS. 9A, 9B and 9C are drawings showing a half wavelength type antenna having a microstrip-line constitution showing—a sixth embodiment of the present invention in which FIG. 9A is a plane view thereof, FIG. 9B is a sectional view of a side thereof and FIG. 9C is a plane view of a rear face thereof. In FIGS. 9A, 9B and 9C, numeral 45 designates an antenna conductor, numeral 46 designates a ground conductor, numeral 47 designates a dielectric member, numeral 48 designates a through hole, numeral 49 designates a feed point and numeral 50 designates a signal input/output terminal A point of the embodiment different from the embodiment of FIGS. 5A, 5B and 5C resides in arranging the dielectric member 47 only between the antenna pattern 45 and the earth conductor 50.

Figure 10A:
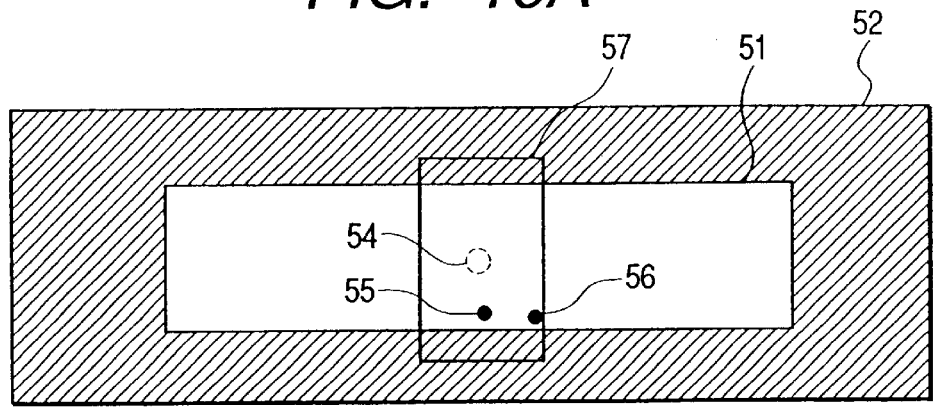
FIG. 10A is a plane view of a wireless tag according to a seventh embodiment.
Figure 10B:
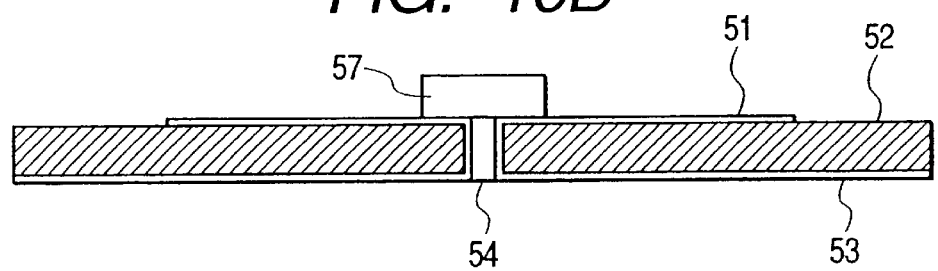
FIG. 10B is a sectional view of a side face of the wireless tag according to the seventh embodiment.

FIGS. 10A and 10B are drawings showing a wireless tag having a half wavelength type antenna having a microstrip-line constitution showing a seventh embodiment of the present invention in which FIG. 10A is a plane view thereof, and FIG. 10B is a sectional view of a side face thereof.

Numeral 51 designates an antenna conductor, numeral 52 designates a ground conductor, numeral 53 designates a dielectric member, numeral 54 designates a through hole, numeral 55 designates a ground point, numeral 56 designates a feed point and numeral 57 designates a circuit portion. The feed point 56 constituting a signal input/output portion of a rectenna circuit for rectifying current, supplying power to a circuit portion of the wireless tag and modulating and demodulating signals inputted to or outputted from the circuit portion 57, is provided at a point on a side of an open end of the antenna conductor 51 remote from the through hole 54 constituting an electrical ground point of the antenna conductor 51 and the ground point 55 is provided to be proximate to the through hole. According to the example, the circuit portion 57 is provided on the-side of the antenna conductor face.

Figure 11A:
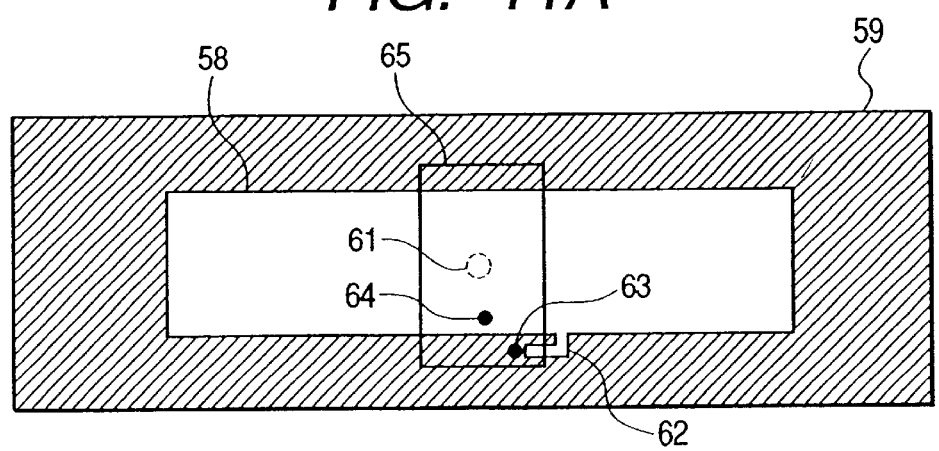
FIG. 11A is a plane view of a wireless tag according to an eighth embodiment.
Figure 11B:
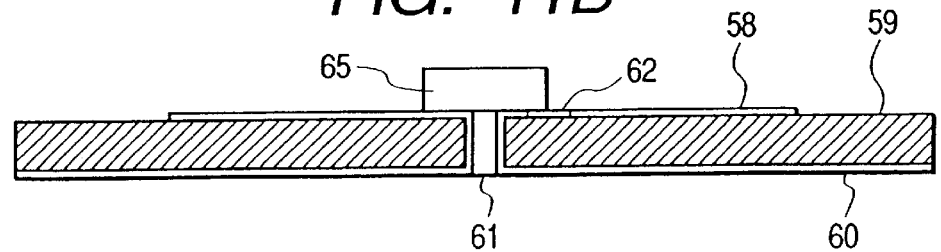
FIG. 11B is a sectional view of a side face of the wireless tag according to the eighth embodiment.

FIGS. 11A and 11B are drawings of a wireless tag constituted by a half wavelength-antenna comprising a microstrip-line and a circuit portion showing an eighth embodiment of the present invention. FIG. 11A is a plane view thereof and FIG. 11B is a sectional view of a side face thereof. In FIGS. 11A and 11B, numeral 58 designates an antenna conductor, numeral 59 designates a dielectric member, numeral 60 designates a ground conductor, numeral 61 designates a through hole, numeral 62 designates an atmospherics-line, numeral 63 designates a signal input/output terminal, numeral 64 designates a ground point and numeral 65 designates a circuit portion. A point of the embodiment different from FIGS. 10A and 10B showing the seventh embodiment resides in that the signal input/output terminal 63 is provided on the dielectric member substrate plate 59 and connected to the circuit portion via a feed point on a side of the antenna conductor 58 via the feed line 62 Even in the case in which the feed point is remote from a region occupied by the circuit portion 65, circuit connection can easily be carried out by lengthening the feed line.

Figure 12A:
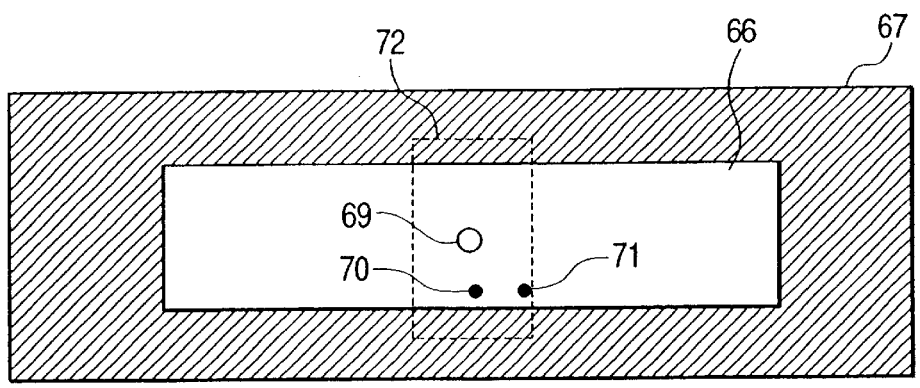
FIG. 12A is a plane view of a wireless tag according to a ninth embodiment.
Figure 12B:
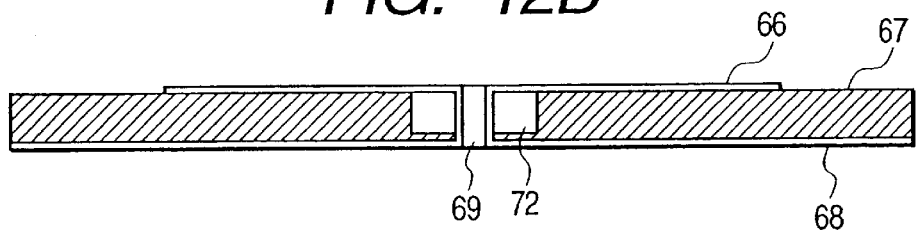
FIG. 12B is a sectional view of a side face of the wireless tag according to the ninth embodiment.

FIGS. 12A and 12B are drawings showing a half wavelength type wireless tag comprising a microstrip-line showing a ninth embodiment of the present invention in which FIG. 12A is a plane view thereof and FIG. 12B is a sectional view of a side face thereof. In FIGS. 12A and 12B, numeral 66 designates an antenna conductor, numeral 67 designates a dielectric member, numeral 68 designates a ground conductor, numeral 69 designates a through hole, numeral 70 designates a ground point, numeral 71 designates a feed point and numeral 72 designates a circuit portion. A point of the embodiment different from the embodiment of FIGS. 10A and 10B resides in that the ground point 70 and the feed point 71 are provided at the rear face of the antenna conductor 66 and the circuit portion 72 is formed at a removed portion of the dielectric member 67 between the antenna conductor 66 and the ground conductor 68.

Figure 13A:
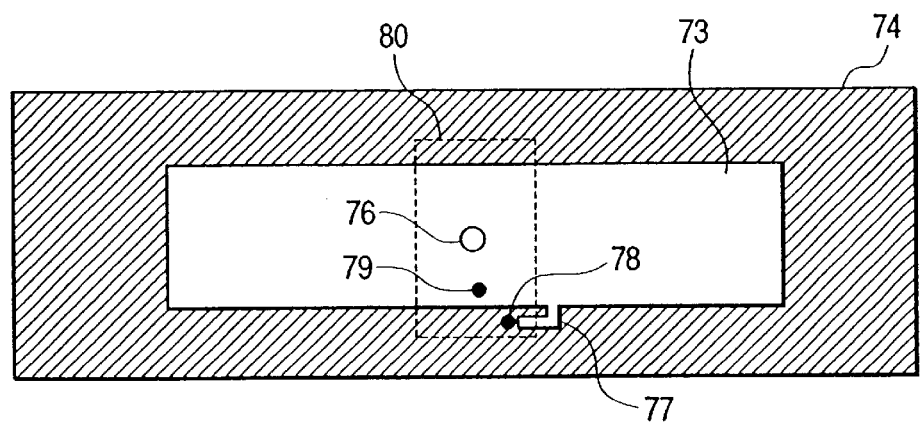
FIG. 13A is a plane view of a wireless tag according to a tenth embodiment.
Figure 13B:
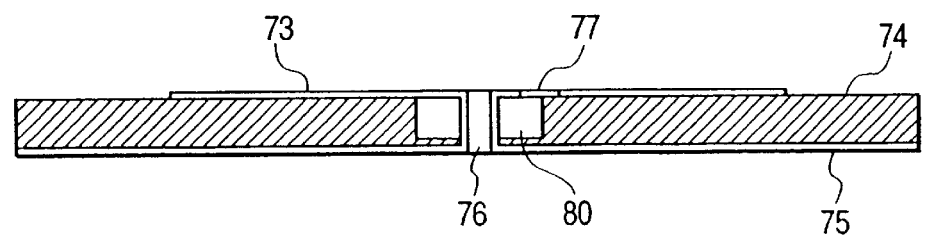
FIG. 13B is a sectional view of a side face of the wireless tag according to the tenth embodiment.

FIGS. 13A and 13B are drawings of a half wavelength type wireless tag constituted by a microstrip-line showing a tenth embodiment of the present invention in which FIG. 13A shows a plane view thereof and FIG. 13B shows a sectional view of a side face thereof, numeral 73 designates an antenna conductor, numeral 74 designates a dielectric member plate, numeral 75 designates an earth conductor plate, numeral 76 designates a through hole, numeral 77 designates a feed line, numeral 78 designates a signal input/output terminal, numeral 79 designates an earth point and numeral 80 designates a circuit portion. A point of the embodiment different from the embodiment of FIG. 11 resides in forming the wireless tag by providing the circuit portion 80 in the dielectric member substrate 74 or embedding the circuit portion therein.

The reason of providing the circuit portion constituting the wireless tag in each of the embodiments of FIGS. 10A and 10B, FIGS. 11A and 11B, FIGS. 12A and 12B and FIGS. 13A and 13B resides in reducing as less as possible a potential difference between the earth point of the circuit portion and the earth point of the antenna (through hole), suppressing noise interference and improving matching performance between the circuit portion and the antenna at high frequencies.

Figure 14A:
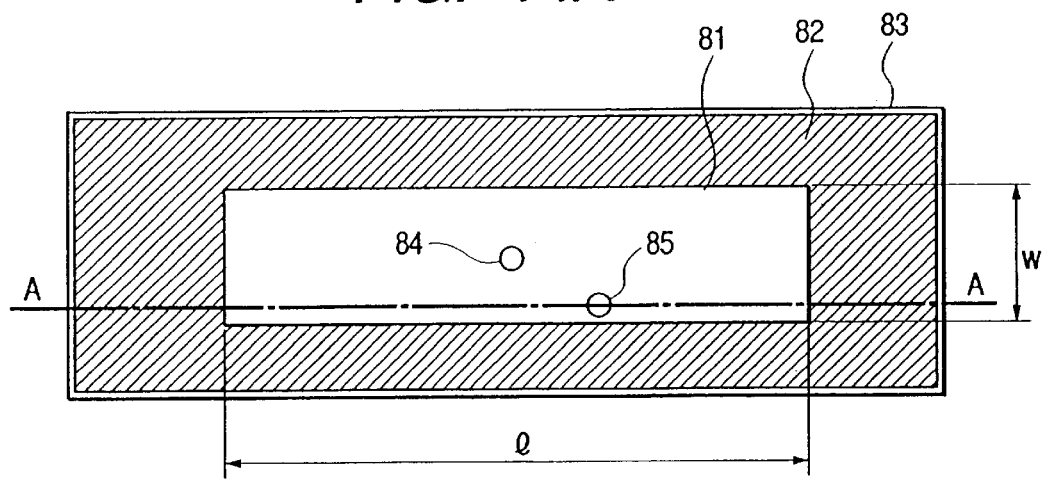
FIG. 14A is a plane view of an antenna for a wireless tag according to an eleventh embodiment.
Figure 14B:
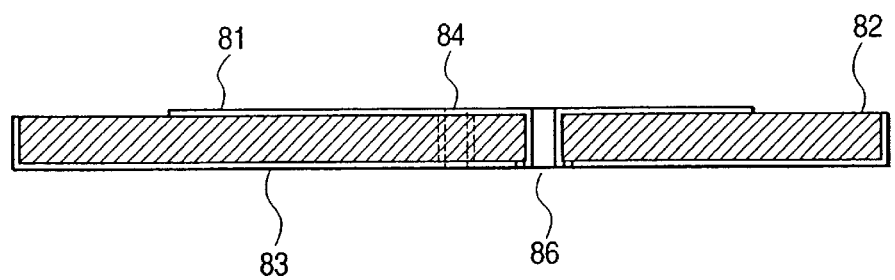
FIG. 14B is a sectional view of a side face of the antenna for the wireless tag according to the eleventh embodiment.
Figure 14C:
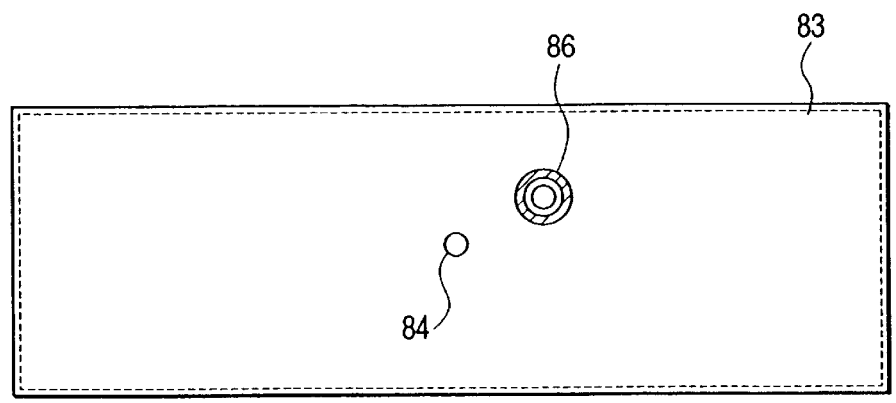
FIG. 14C is a plane view of a rear face of the antenna for the wireless tag according to the eleventh embodiment.

FIGS. 14A, 14B and 14C are drawings showing a wireless tag constituted by a microstrip-line showing an eleventh embodiment of the present invention in which FIG. 14A is a plane view of a half wavelength type antenna thereof and FIG. 14B is a sectional view of a side face thereof and FIG. 14C is a plane view of a rear face thereof. In FIGS. 14A, 14B and 14C, numeral 81 designates an antenna conductor, numeral 82 designates a dielectric member, numeral 83 designates a ground conductor, numeral 84 designates a through hole, numeral 85 designates a feed point and numeral 86 designates a signal input/output terminal. A point of the embodiment different—from the embodiment of FIGS. 5A, 5B and 5C resides in that in FIGS. 5A, 5B and 5C, while the ground conductor plate is formed in a plate-like shape and is restricted by the size of the dielectric member, in FIGS. 14A, 14B and 14C, the earth conductor 83 covers end faces of the dielectric member 82 and the ground point is extended up to the face of the dielectric member relative to the antenna conductor 81. When the plate thickness of the dielectric member plate 82 is thin, the ground conductor covering the end face portions does not have an influence of changing the ground point of the antenna, however, when the plate thickness of the dielectric member plate 82 is thickened, in the case in which the wireless tags are arranged to be proximate to each other, there is achieved an effect of improving a drawback of changing an impedance between the wireless tags at high frequencies to thereby change the radiation characteristic of the antenna.

Figure 15A:
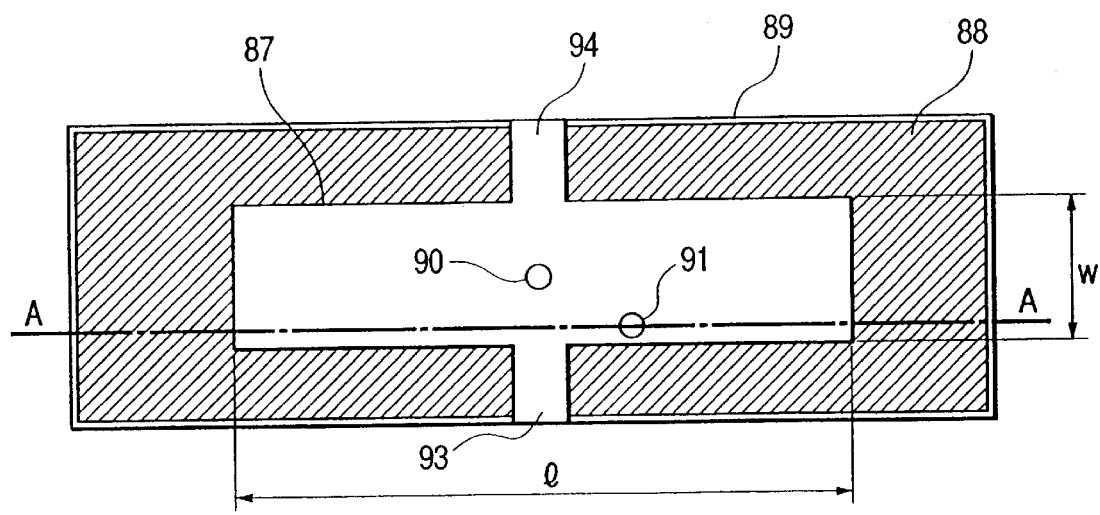
FIG. 15A is a plane view of an antenna for a wireless tag according to a twelfth embodiment.
Figure 15B:
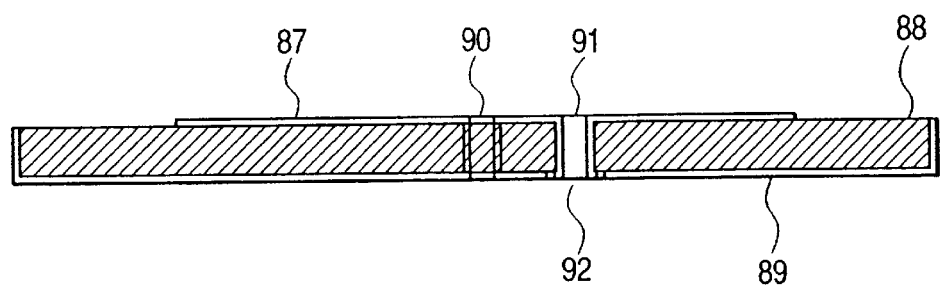
FIG. 15B is a sectional view of a side face of the antenna for the wireless tag according to the twelfth embodiment.
Figure 15C:
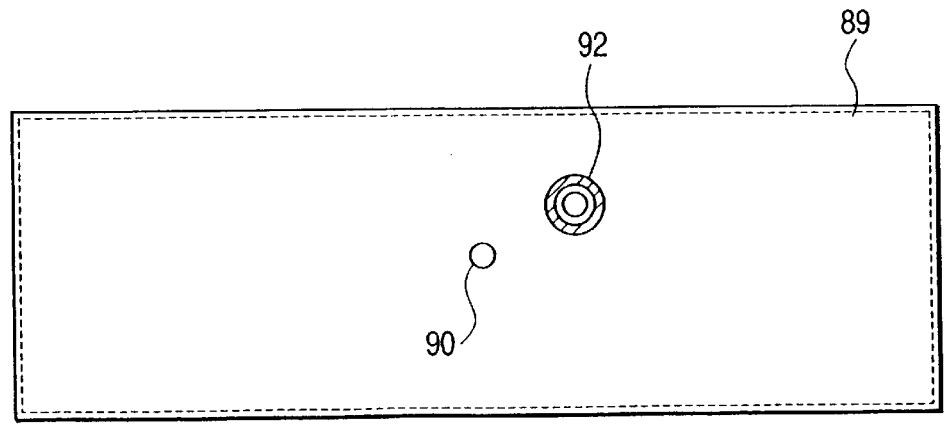
FIG. 15C is a plane view of a rear face of the antenna for the wireless tag according to the twelfth embodiment.

FIGS. 15A, 15B and 15C are drawings showing a half wavelength type antenna of a wireless tag having a microstrip-line constitution according to a twelfth embodiment of the present invention in which FIG. 15A is a plane view thereof, FIG. 15B is a sectional view of a side face thereof and FIG. 15C is a plane view of a rear face thereof. In FIGS. 15A, 15B and 15C, numeral 87 designates an antenna conductor, numeral 88 designates a dielectric member, numeral 89 designates a ground conductor, numeral 90 designates a through hole, numeral 91 designates a feed point, numeral 92 designates a signal input/output terminal and numerals 93 and 94 designate ground lines. A point of the embodiment different from the eleventh embodiment of FIGS. 14A, 14B and 14C resides in providing the ground lines 93 and 94 between positions of substantially middle points of the antenna conductor and the ground conductor 89, achieving an effect of further reducing the impedance relative to the ground impedance of the through hole 90 and achieving an effect of narrowing a matching frequency band by double-tuning of antennas of the antenna conductor 87 in correspondence with a quarter wavelength.

Figure 16A:
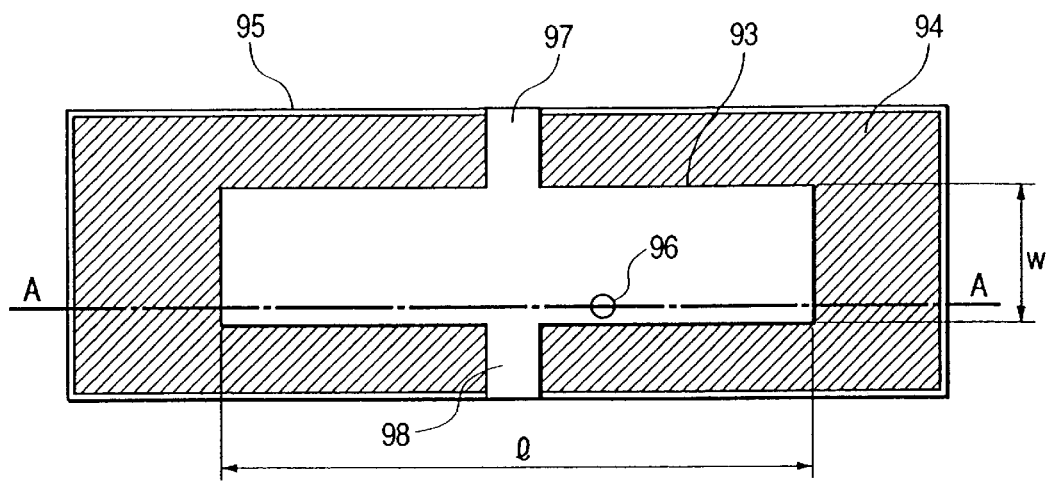
FIG. 16A is a plane view of an antenna for a wireless tag according to a thirteenth embodiment.
Figure 16B:
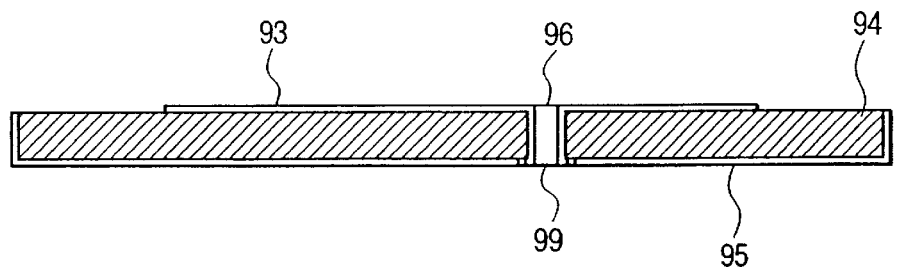
FIG. 16B is a sectional view of a side face of the antenna for the wireless tag according to the thirteenth embodiment.
Figure 16C:
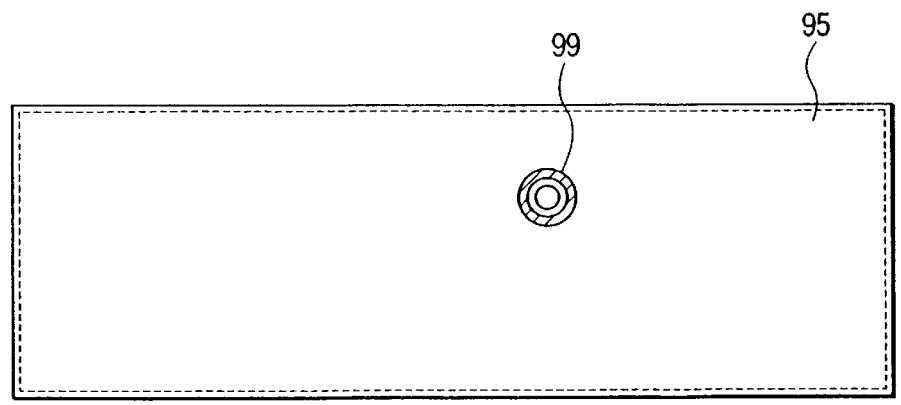
FIG. 16C is a plane view of a rear face of the antenna for the wireless tag according to the thirteenth embodiment.

FIGS. 16A, 16B and 16C are drawings showing a half wavelength type antenna for a wireless tag constituted by a microstrip-line showing a thirteenth embodiment of the present invention in which FIG. 16A is a plane view thereof, FIG. 16B is a sectional view of a side face thereof and FIG. 16C is a plane view of a rear face thereof. In FIGS. 16A, 16B and 16C, numeral 93 designates an antenna conductor, numeral 94 designates a dielectric member, numeral 95 designates a ground conductor, numeral 96 designates a feed point, numerals 97 and 98 designate ground lines and numeral 99 designates a signal input/output terminal. A point of the embodiment different from FIGS. 15A, 15B and 15C resides in that the antenna conductor 93 is not provided with a through hole at its central portion and is electrically and mechanically connected to the earth conductor by the ground lines 97 and 98. The magnitude of the inductor MI indicated by the equivalent circuit of FIG. 4 can be changed by adjusting the ground lines 97 and 98 using the widths and lengths of the ground lines as parameters; therefore, the matching frequency band at high frequencies by double-tuning can freely be set.

Figure 17A:
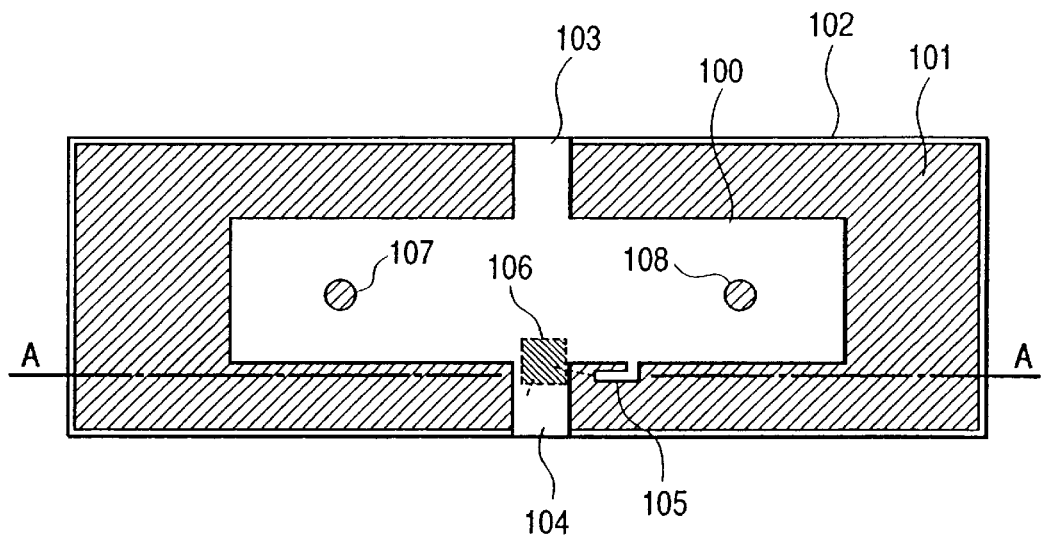
FIG. 17A is a plane view of a wireless tag according to a fourteenth embodiment.
Figure 17B:
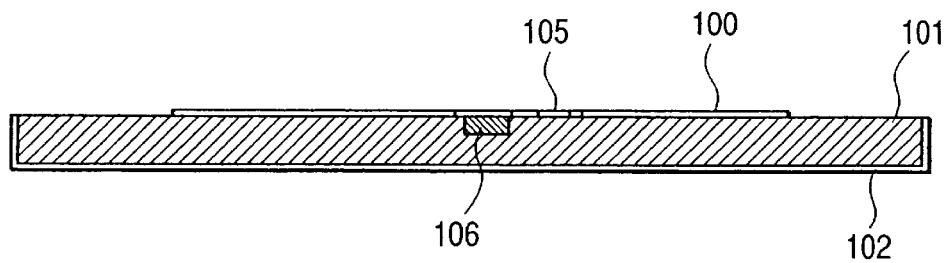
FIG. 17B is a sectional view of a side face of the wireless tag according to the fourteenth embodiment.
Figure 17C:
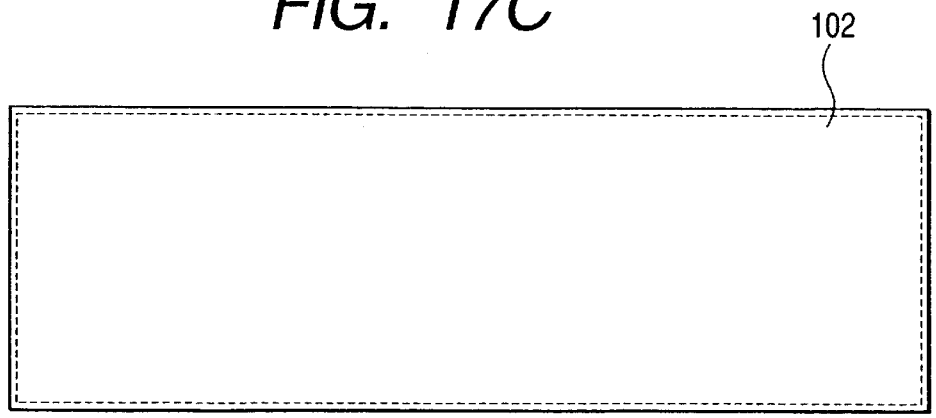
FIG. 17C is a plane view of a rear face of the wireless tag according to the fourteenth embodiment.

FIGS. 17A, 17B and 17C are drawings showing a wireless tag constituted by a microstrip-line showing a fourteenth embodiment of the present invention in which FIG. 17A is a plane view thereof, FIG. 17B is a sectional view of a side face thereof and FIG. 17C is a plane view of a rear face thereof. In FIGS. 17A, 17B and 17C, numeral 100 designates an antenna conductor, numeral 101 designates a dielectric member, numeral 102 designates a ground conductor, numerals 103 and 104 designate ground lines, numeral 105 designates a feed line and numeral 106 designates an IC and numerals 107 and 108 designate holes. A circuit of the wireless tag including a rectifying circuit of a rectenna is constituted by IC formation to thereby form the IC 106 by technologies of wire bonding and the like, the circuit is embedded in a dielectric member material on a ground conductor side by a rear face of the ground line 104 connected to the central portion of the antenna conductor 100, an earth portion of IC 106 is grounded and at the same time, an input/output portion of IC 106 is connected to a face on a side of the ground conductor of the feed line 105. The holes 107 and 108 provided at the antenna 100 improve a performance of adhering the dielectric member material and the antenna conductor to thereby prevent the antenna conductor 100 from floating up from the dielectric member 101.

Figure 18A:
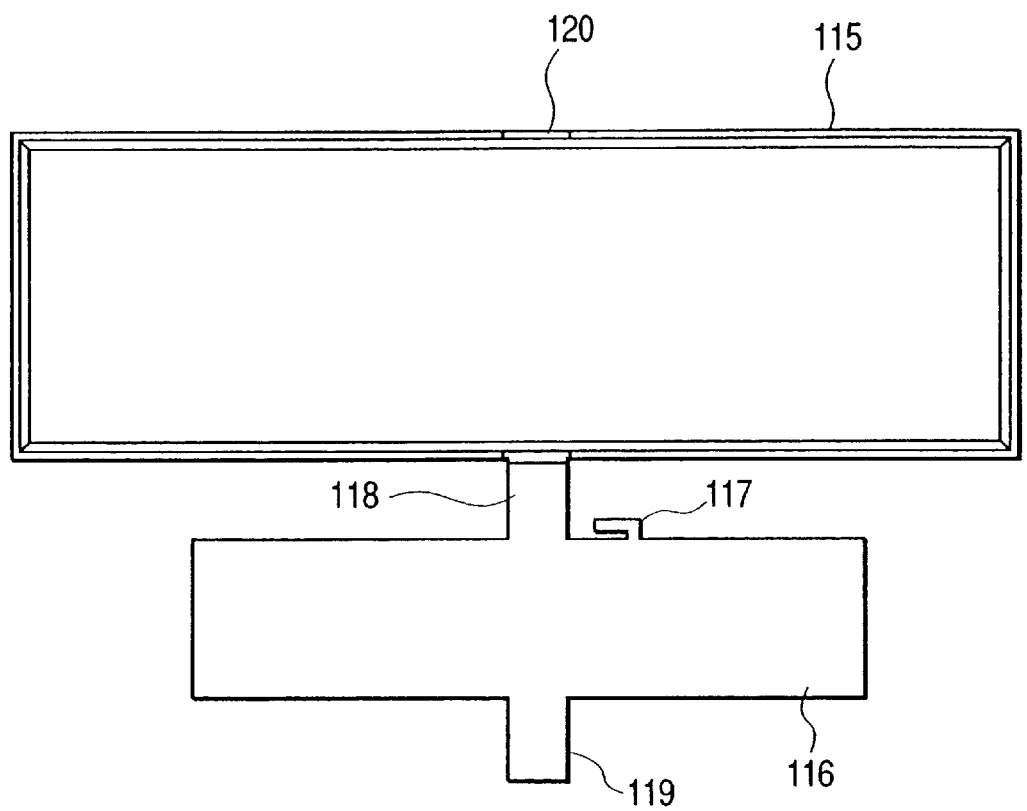
FIG. 18A is a plane view for explaining conductor formation of a wireless tag according to a fifteenth embodiment.
Figure 18B:
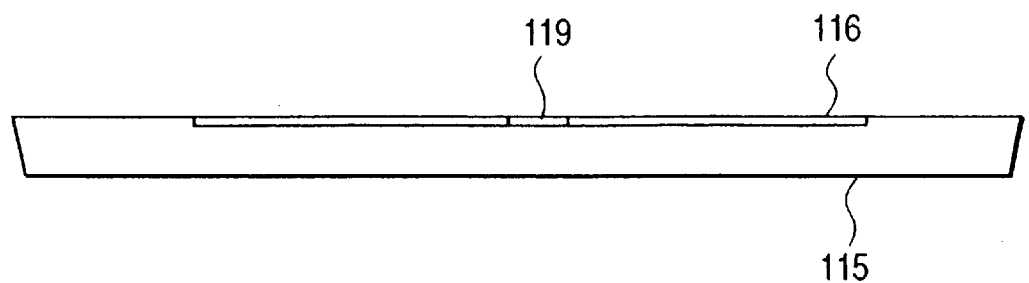
FIG. 18B is a side view for explaining the conductor formation of the wireless tag according to the fifteenth embodiment.
Figure 19A:
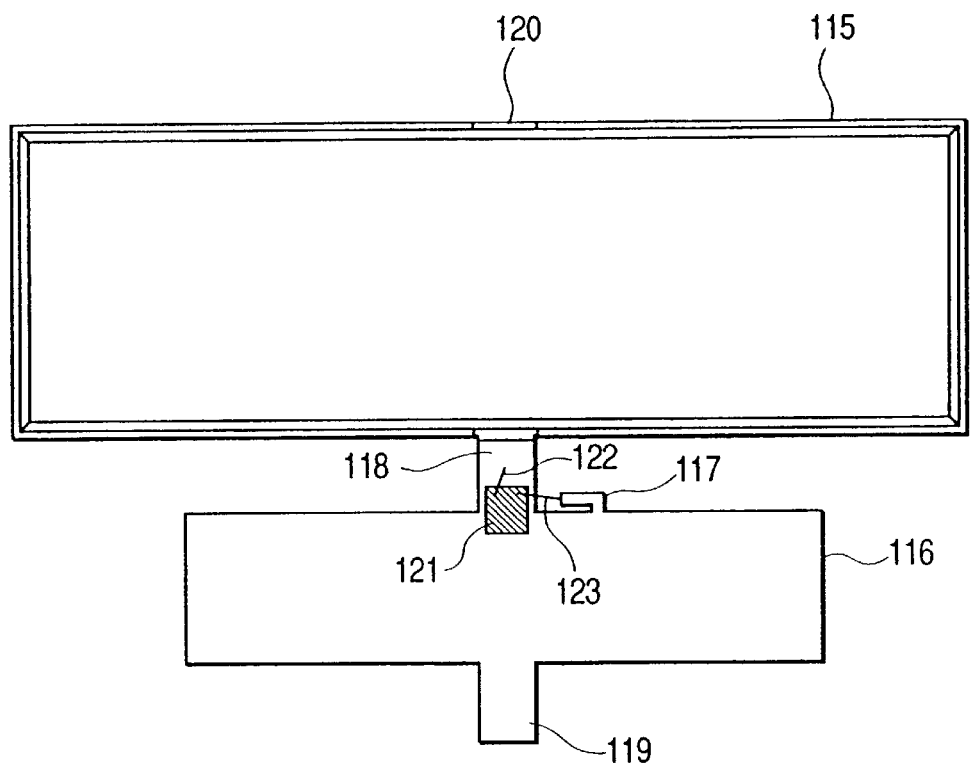
FIG. 19A is a plane view for explaining an IC mounting step of the wireless tag according to the fifteenth embodiment.
Figure 19B:
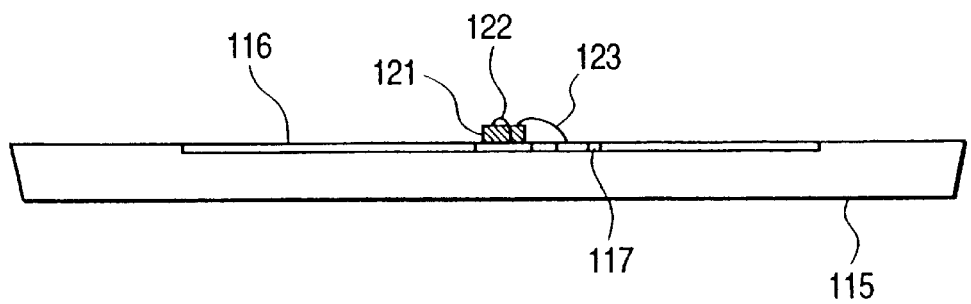
FIG. 19B is a side view for explaining the IC mounting step of the wireless tag according to the fifteenth embodiment.
Figure 20A:
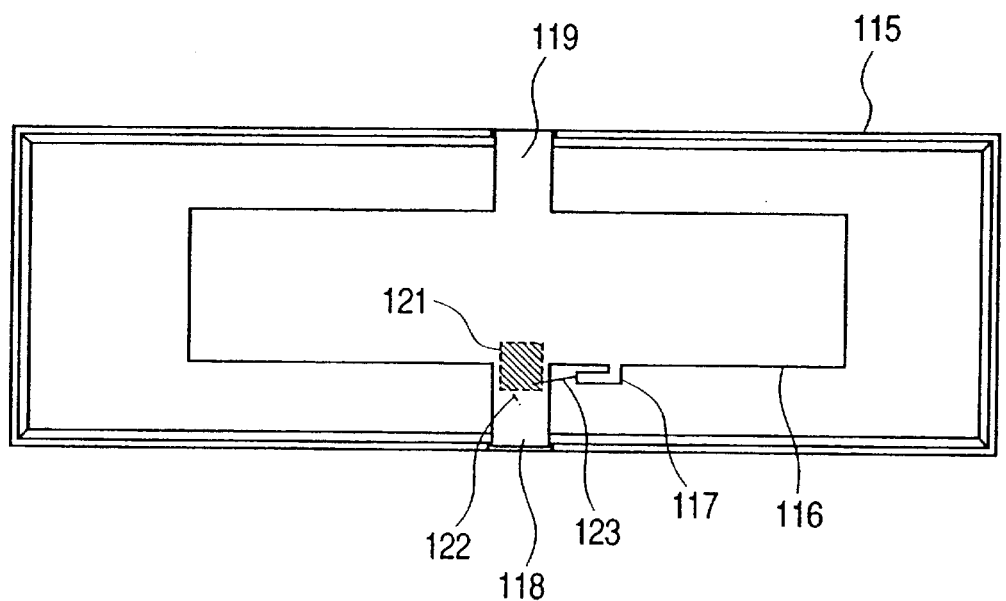
FIG. 20A is a plane view for explaining an integrating step of the wireless tag according to the fifteenth embodiment.
Figure 20B:
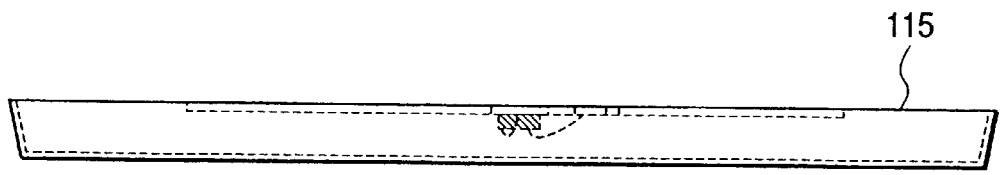
FIG. 20B is a side view for explaining the integrating step of the wireless tag according to the fifteenth embodiment.
Figure 21A:
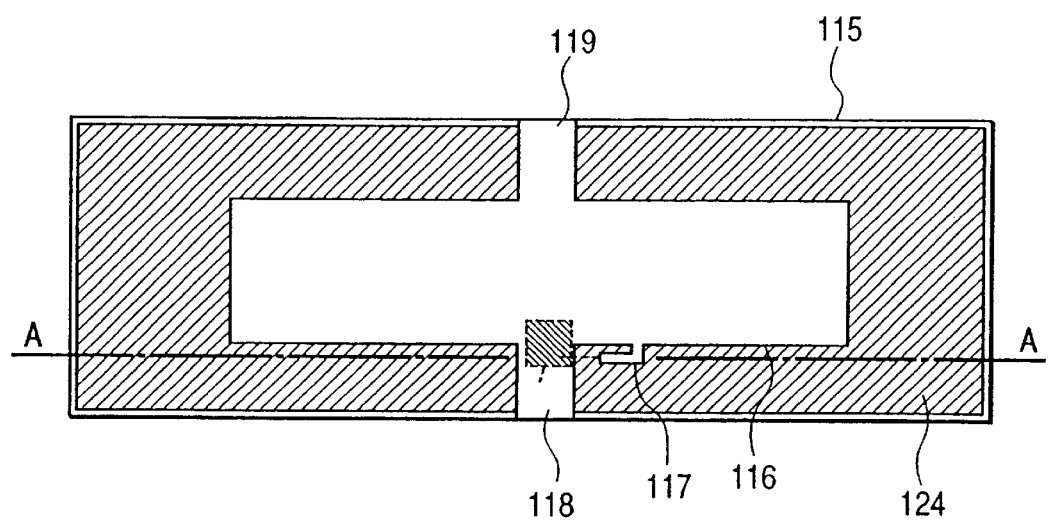
FIG. 21A is a plane view for explaining a dielectric member injecting step of the wireless tag according to the fifteenth embodiment.
Figure 21B:
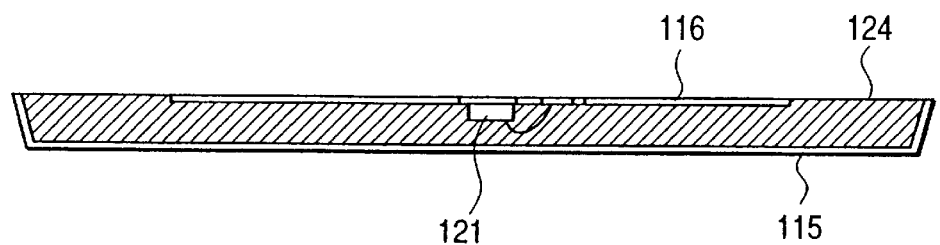
FIG. 21B is a sectional view of a side face for explaining the dielectric member injecting step of the wireless tag according to the fifteenth embodiment.
Figure 21C:
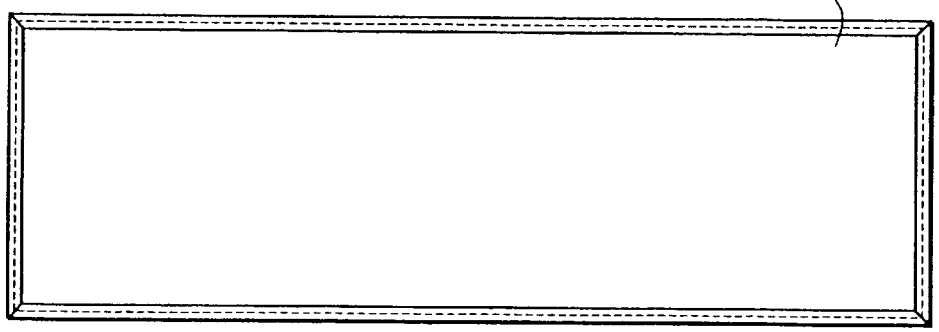
FIG. 21C is a plane view of a rear face for explaining the dielectric member injecting step of the wireless tag according to the fifteenth embodiment.

FIGS. 18A and 18B show mounting of a wireless tag and its structure showing a fifteenth embodiment of the present invention. An antenna portion of the wireless tag having a microstrip-line constitution is manufactured to shape as shown by the plane view of FIG. 18A and the side view of FIG. 18B by pressing a thin plate member of copper, copper alloy or iron alloy for a lead frame in an IC mounting technology of transfermolding or the like. In FIGS. 18A and 18B, numeral 115 designates a ground conductor, numeral 116 designates an antenna conductor, numeral 117 designates a feed line, numerals 118 and 119 designate ground lines and numeral 120 designates a fitting portion. The antenna conductor 116, the ground lines 118 and 119, the feed line 117 and the ground conductor 115 are integrally shaped. FIGS. 19A and 19B are drawings for explaining a next stage of mounting operation according to the embodiment of the present invention in which FIG. 19A is a plane view thereof and FIG. 19B is a side view thereof and an element operating in a fashion similar to that shown in FIGS. 18A and 18B have the same numeral designation. In FIGS. 19A and 19B, numeral 121 designates an IC and numerals 122 and 123 designate bonding wires. A ground portion of the IC 121 fixed a side of the earth line 118 of the antenna conductor 116 by an adhering agent, is electrically connected to a surface side of the ground line 118 by the bonding wire 122. At the same time, a signal input/output portion of the IC 121 is electrically connected to an open end of the feed line 118 by bonding wire 123. At this occasion, in an IC constitution in which a ground face can be formed on a side opposed to a face formed with a connecting pad of the IC 121, the bonding wire 122 is dispensed with and the attachment of the IC 121 to the antenna conductor 116 or the ground line 118 may be carried out electrically and mechanically by a conductive adhering agent. FIGS. 20A and 20B are drawings for explaining a next step for mounting according to the embodiment of the present invention in which FIG. 20A is a plane view thereof and FIG. 20B is a side view thereof. In FIGS. 20A and 20B, an element which operates in a fashion similar to that shown in FIGS. 18A and 18B has the same numerical designation. In reference to the plane view of FIG. 20A, the ground line 118 in FIGS. 19A and 19B is folded at a portion thereof connected to the ground conductor 115 and is arranged in a state of a lid at an opening portion of the ground conductor 115 in a box-like shape. At this occasion, an open end of the ground line 119 is fitted to the fitting portion of the ground conductor 115 by press fitting, welding, soldering or the like and is electrically and mechanically connected thereto. Under the state, the dielectric member is constituted by air and accordingly, according to the embodiment having the microstrip-line constitution, the shortening of the wavelength is not carried out and a length in the longitudinal direction of the wireless tag is lengthened. Further, the dielectric member is air and accordingly, there is needed a structure in which the antenna conductor 116 is mechanically supported by auxiliary means using a material having a—small specific inductive capacity such as a foaming agent. FIGS. 21A, 21B and 21C are drawings showing a final step of the steps according to the embodiment in which FIG. 21A is a plane view thereof, FIG. 21B is a sectional view of a side face taken along a line A—A in FIG. 21A and FIG. 21C is a plane view of a rear face thereof. An element which operates in a fashion similar to that shown in FIGS. 18A and 18B, FIGS. 19A and 19B and FIGS. 20A and 20B has the same numerical designation. In FIGS. 21A, 21B and 21C, numeral 124 designates a dielectric member. By injecting a molding material for transfermolding into a container formed by the ground conductor 115 and the antenna conductor 116 under the state of FIGS. 20A and 20B, IC 121 and the bonding wires 122 and 123 around IC 121 are mechanically fixed and protection of IC 121 and the bonding wires 122 and 123 is achieved by preventing moisture caused by humidity from invading from outside.

Figure 22A:
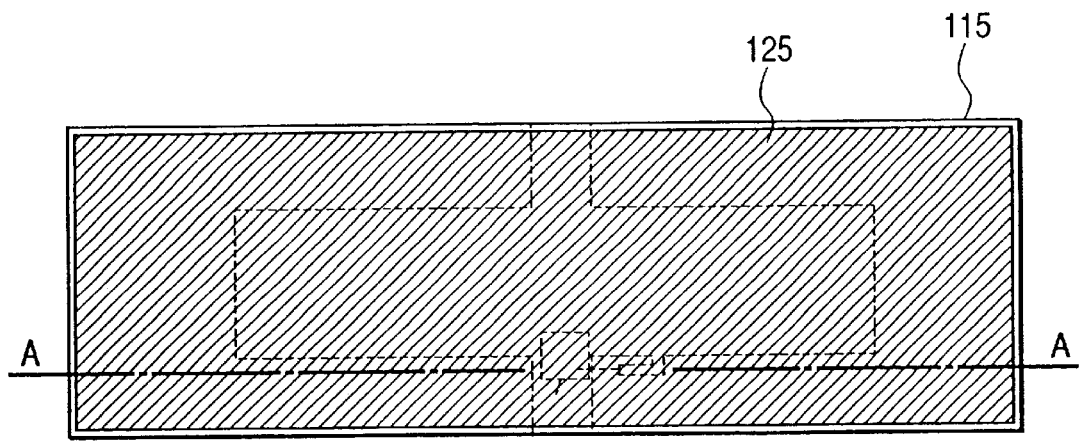
FIG. 22A is a plane view of a wireless tag according to a sixteenth embodiment.
Figure 22B:
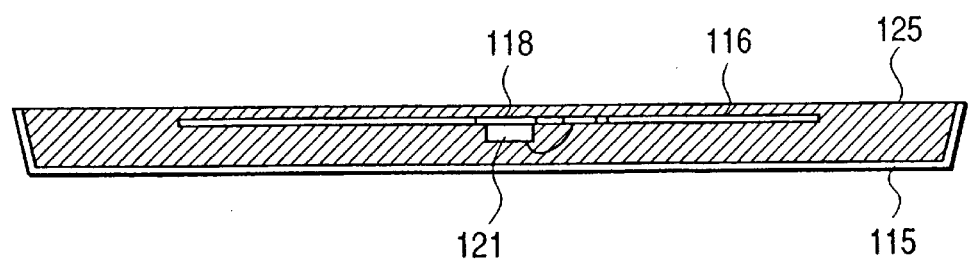
FIG. 22B is a sectional view of a side face of the wireless tag according to the sixteenth embodiment.
Figure 22C:
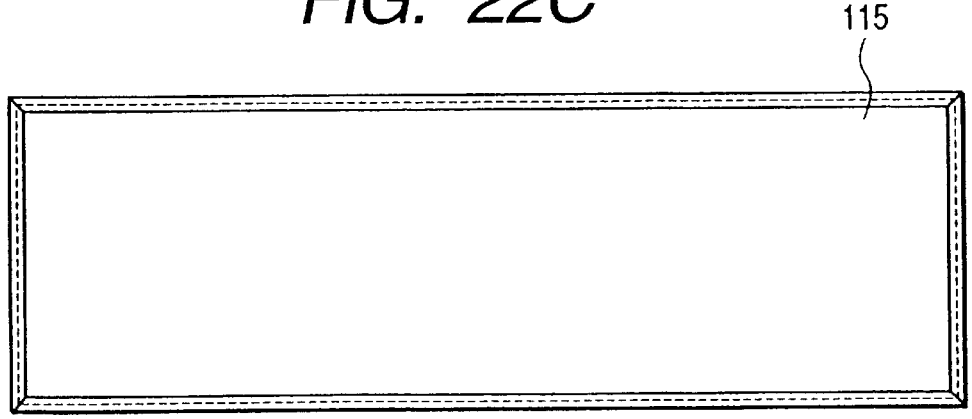
FIG. 22C is a plane view of a rear face of the wireless tag according to the sixteenth embodiment.

FIGS. 22A, 22B and 22C are drawings showing a sixteenth embodiment in mounting a wireless tag having a microstrip-line. Restructure in which FIG. 22A is a plane view thereof, FIG. 22B is a sectional view of a side face taken along a line A—A of FIG. 22A and FIG. 22C is a plane view of a rear face thereof. An element which operates in a fashion similar to that shown in FIGS. 21A, 21B and 21C have the same numerical designation. In FIGS. 22A, 22B and 22C, numeral 125 designates a dielectric member. According to the embodiment, by constructing a structure in which the dielectric member 125 covers to embed the antenna conductor 116, humidity invading from a space between the antenna conductor 116 and the dielectric member 1:24 of FIGS. 21A, 21B and 21C can effectively be prevented.

Figure 23:
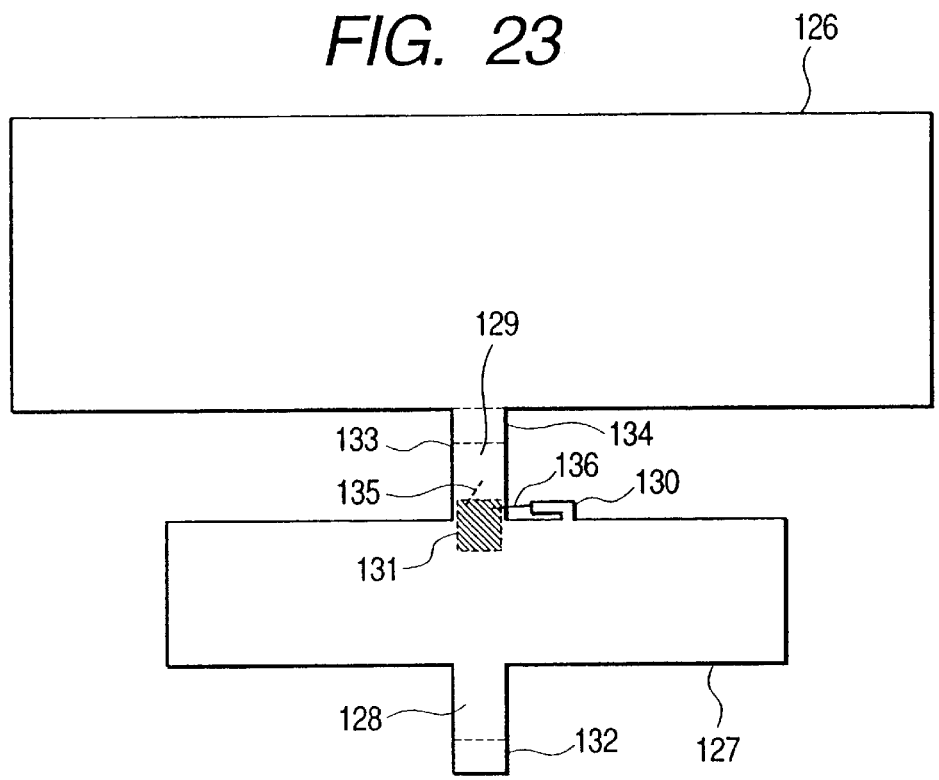
FIG. 23 shows conductor formation and an IC mounting step of a wireless tag according to a seventeenth embodiment.
Figure 24A:
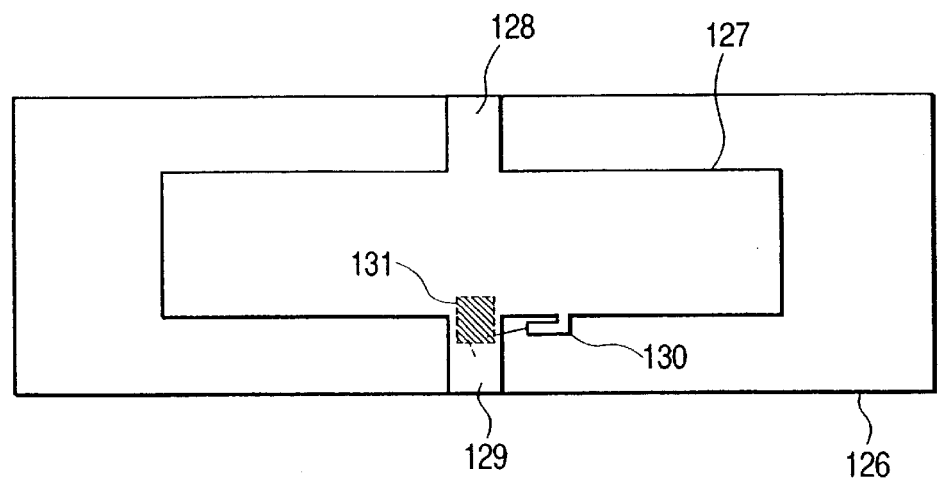
FIG. 24A is a plane view for explaining integration and constitution of the wireless tag according to the seventeenth embodiment.
Figure 24B:
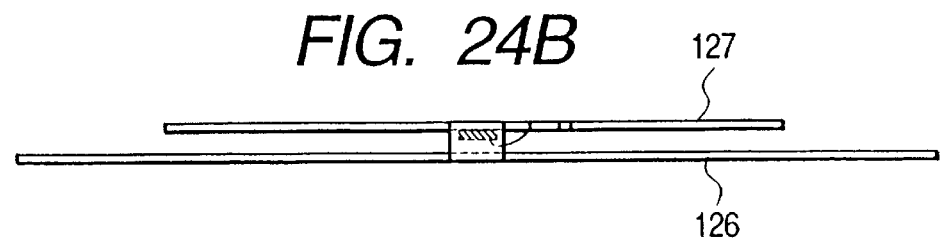
FIG. 24B is a side view for explaining integration and constitution of the wireless tag according to the seventeenth embodiment.

FIG. 23 is a plane view of a structure of mounting a wireless tag having a microstrip-line constitution showing a seventeenth embodiment of the present invention. In FIG. 23, numeral 126 designates a ground conductor, numeral 127 designates an antenna conductor, numerals 128 and 129 designate ground lines, numeral 130 designates a feed line, numeral 131 designates an IC, numerals 132, 133 and 134 designate folding lines of valley folding and numerals 135 and 136 designate bonding wires. All elements except the IC 131 and the bonding wires 135 and 136 are constituted on a thin plate made of a single sheet of copper, copper alloy or iron alloy. The IC 131 is fixed at a location at a vicinity of a point of connecting the antenna conductor 127 and the ground line 129 of the thin plate having a low electrical potential by an adhering agent or a conductive adhering agent and connected to a point having lower potential on the ground line by the bonding wire 135 and a signal input/output portion of the IC 131 is connected to an open end of a feed line by the bonding wire 136 to thereby input a signal received from the antenna to the IC 131 or to transmit a signal from the IC 131 of the antenna. By folding in valley folding of the valley folding lines 132, 133 and 134, a wireless tag having a microstrip-line constitution is formed as shown by FIGS. 24A and 24B. FIG. 24A is a plane view of a wireless tag and FIG. 24B is a side view thereof. An element which operates in a fashion similar to that shown in FIG. 23 has the same numerical designation. The antenna having the microstrip-line constitution according to the embodiment is provided with a structure having no dielectric member and arranged in air.

Figure 25A:
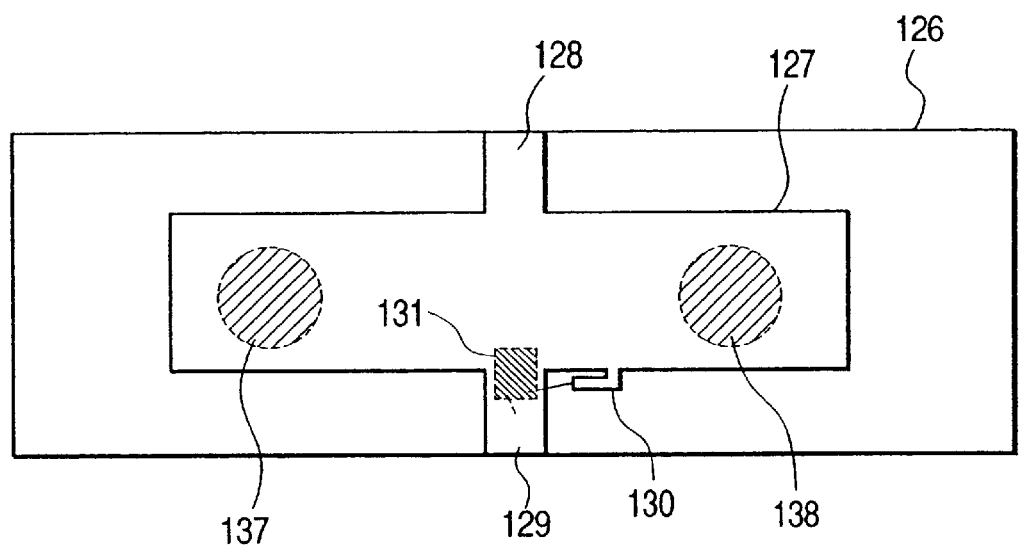
FIG. 25A is a plane view of a wireless tag according to an eighteenth embodiment.
Figure 25B:
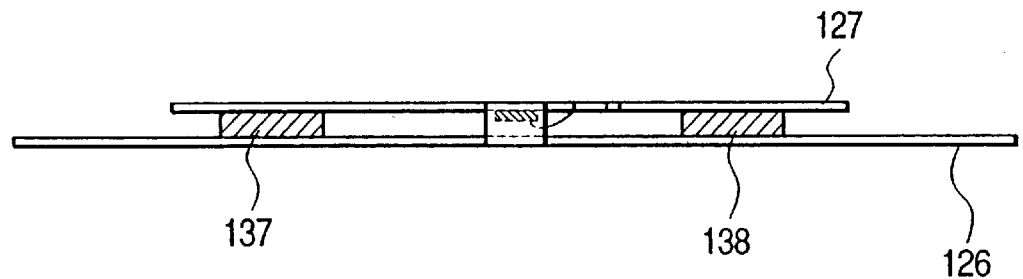
FIG. 25B is a side view of the wireless tag according 5 to the eighteenth embodiment.

FIGS. 25A and 25B are drawings showing a wireless tag having a microstrip-line constitution showing an eighteenth embodiment of the present invention, FIG. 25A is a plane view thereof, FIG. 25B is a side view thereof and an element which operates in a fashion similar to that shown in FIGS. 24A and 24B has the same numerical designation. In FIGS. 25A and 25B, numerals 137 and 138 designate dielectric member supporters. According to the embodiment, there is constructed a structure in which the antenna conductor 127 arranged in air of FIG. 24 is held by the dielectric member supporters formed by the dielectric member, in consideration of increasing mechanical strength of the antenna conductor 127 and stably operating as the antenna of the wireless tag.

Figure 26A:
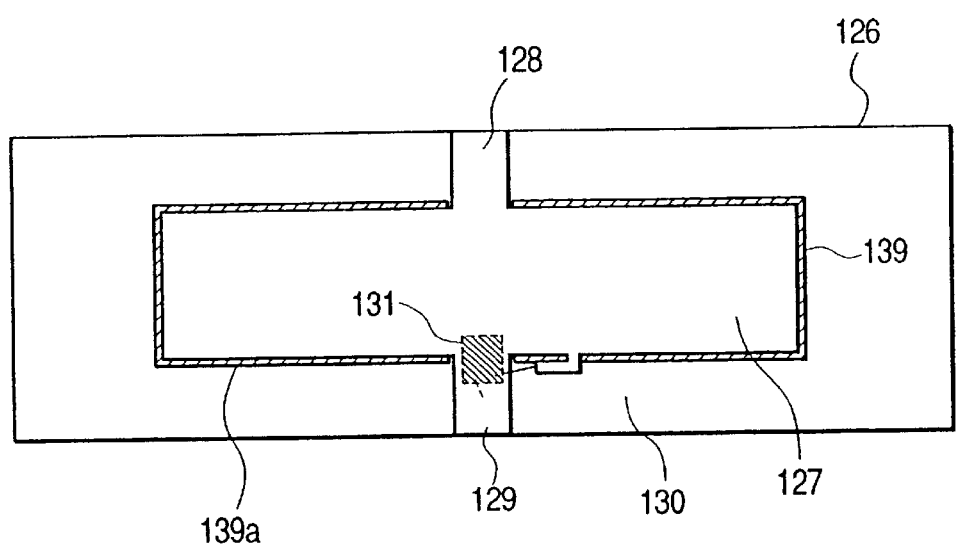
FIG. 26A is a plane view of a wireless tag according to a nineteenth embodiment.
Figure 26B:
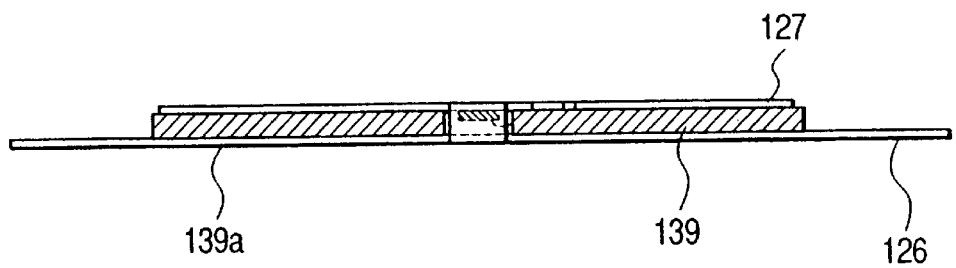
FIG. 26B is a side view of the wireless tag according to the nineteenth embodiment.

FIGS. 26A and 26B are drawings showing a nineteenth embodiment of the present invention and an element which operates in a fashion similar to that shown in FIGS. 24A and 24B has the same numerical designation. In FIGS. 26A and 26B, numerals 139 and 139a designate dielectric members. A point of the embodiment different from the embodiment of FIGS. 24A and 24B resides in interposing the dielectric members 139 and 139a between the antenna conductor 127 and the ground conductor 126. The dielectric members 139 and 139a achieve a significant effect as the dielectric members such as the shortening of the wavelength in the vicinity of the open ends of the antenna. When an expensive dielectric member is utilized, such a means is effective.

Figure 27A:
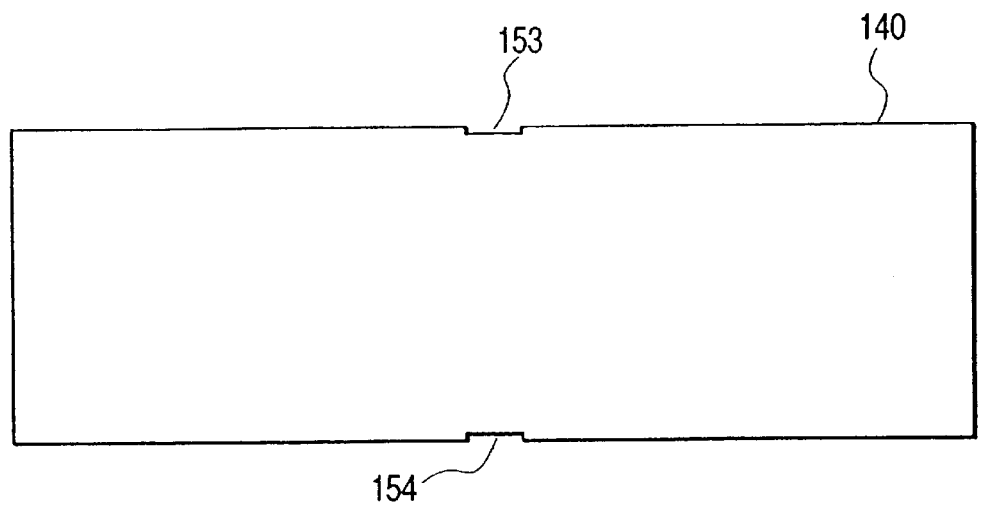
FIG. 27A is a plane view for explaining integration of a wireless tag conductor and IC mounting according to a twentieth embodiment.
Figure 27B:
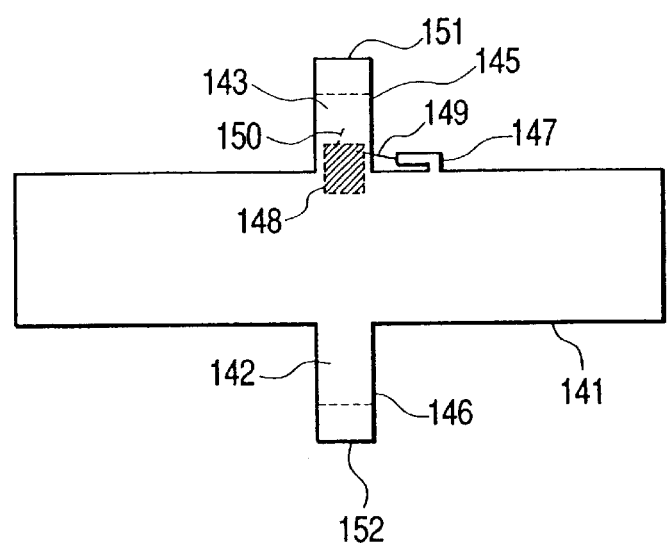
FIG. 27B is a plane view for explaining the integration of the wireless tag conductor and the IC mounting according to the twentieth embodiment.
Figure 27C:
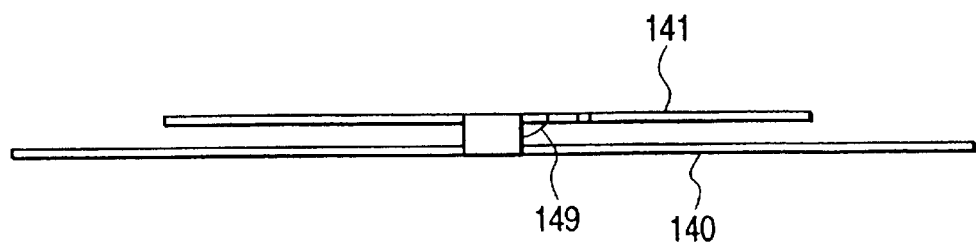
FIG. 27C is a side view for explaining the integration of the wireless tag conductor and the IC mounting according to the twentieth embodiment.

FIGS. 27A, 27B and 27C are drawings showing a wireless tag having a microstrip-line constitution showing a twentieth embodiment of the present invention. FIG. 27A is a plane view of a ground conductor plate, FIG. 27B is a plane view showing a situation of mounting IC with an antenna conductive plate as a main constituent element and FIG. 27C is a side view of a wireless IC tag integrated with constituent elements of FIG. 27A and FIG. 27B.

In FIGS. 27A, 27B and 27C, numeral 140 designates a ground conductor plate, numeral 141 designates an antenna conductor, numerals 142 and 143 designate ground lines, numerals 145 and 146 designate folding lines of valley folding, numeral 147 designates a feed line, numeral 148 designates IC, numerals 149 and 150 designate bonding wires, numerals 151 and 152 designate open ends of ground lines and numerals 153 and 154 designate fitting portions. The ground lines 142 and 143 continuous to the antenna conductor 141 of FIG. 27B are folded to bend at the folding lines 145 and 146, the open ends 151 and 152 are fitted to the fitting portions 154 and 153 of the ground plate and mechanically and electrically connected thereto by a method of press fitting, welding, soldering or the like to thereby provide the wireless tag of the side face as shown by FIG. 27C. According to the wireless tag of the embodiment, there is adopted the microstrip-line constitution constituting air as a dielectric member.

Figure 28A:
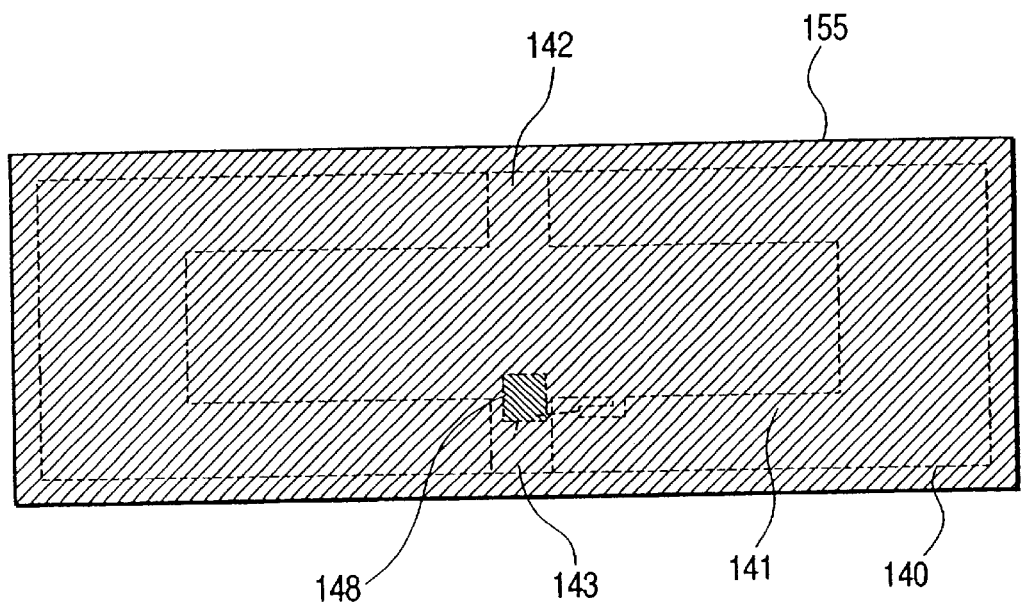
FIG. 28A is a plane view of a wireless tag according to a twenty-first embodiment.
Figure 28B:
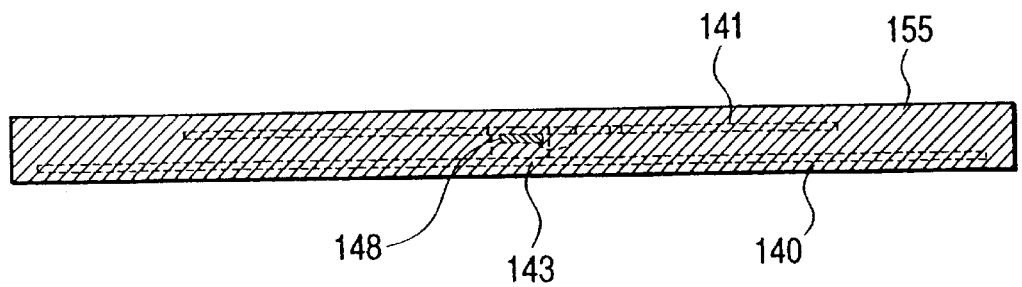
FIG. 28B is a side view of the wireless tag according to the twenty-first embodiment.

FIGS. 28A and 28B show a twenty-first embodiment of a wireless tag having a microstrip-line constitution according to the present invention. FIG. 28A is a plane view thereof and FIG. 28B is a side view thereof. In FIGS. 28A and 28B, an element which operates in a fashion similar to that shown in FIGS. 27A, 27B and 27C has the same numerical designation. In FIGS. 28A and 28B, numeral 155 designates a dielectric member. A point of the embodiment different from the embodiment of FIGS. 27A, 27B and 27C resides in enveloping the entire wireless tag with the dielectric member. Naturally, the dielectric member 155 is uniformly filled between the ground conductor 140 and the antenna conductor 141.

Figure 29A:
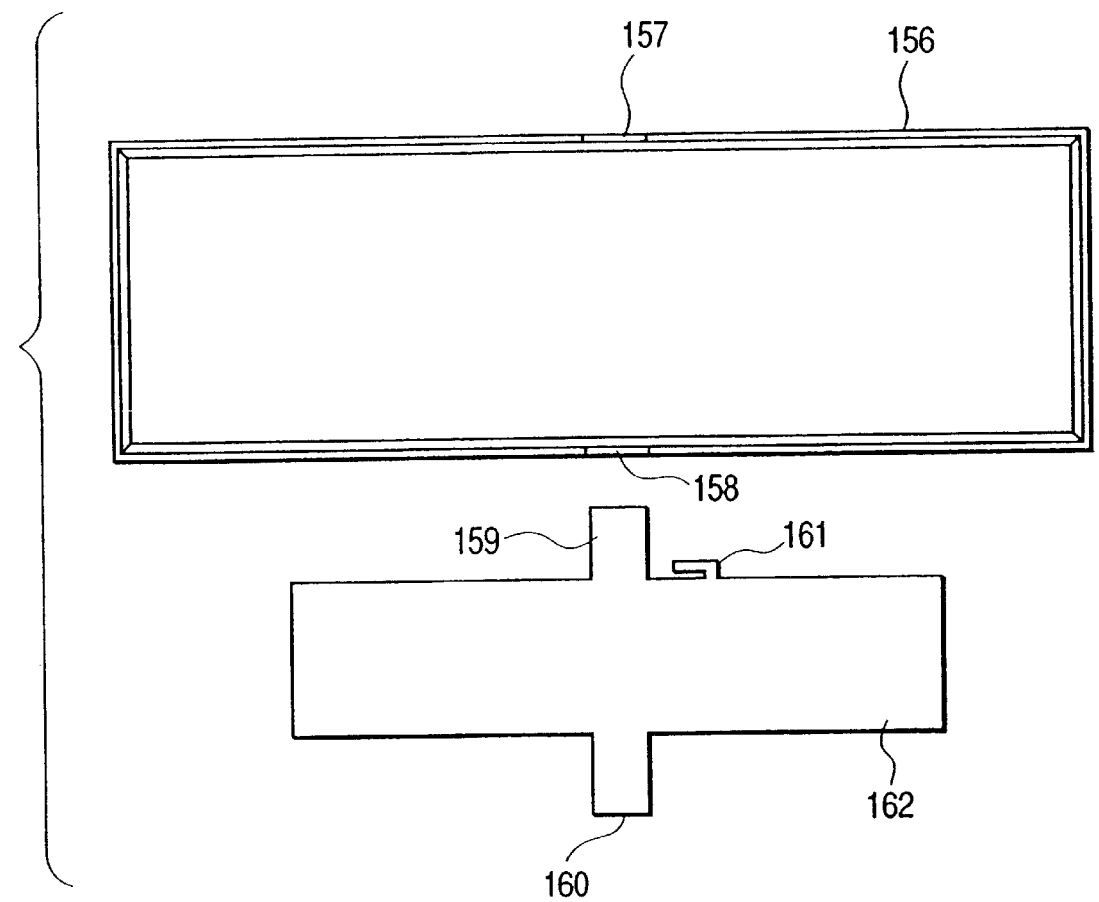
FIG. 29A is a plane view of a conductor of an antenna for the wireless tag according to a twenty-second embodiment.
Figure 29B:
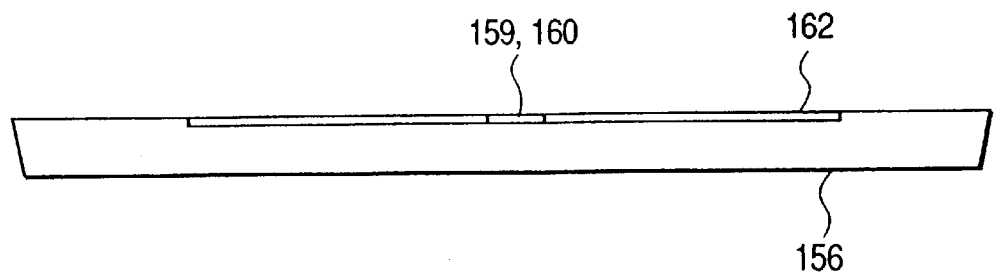
FIG. 29B is a side view of the conductor of the antenna for the wireless tag according to the twenty-second embodiment.

FIGS. 29A and 29B are drawings showing a twenty-second embodiment of the present invention, FIG. 29A is a plane view showing a structure of mounting a wireless tag comprising an antenna using a microstrip-line and FIG. 29B is a side view thereof. In FIGS. 29A and 29B, numeral 156 designates a ground conductor formed in a shape of a box one face of which is brought into an opened state, numerals 157 and 158 designate fitting portions, numerals 159 and 160 designate ground lines, numeral 161 designates a feed line and numeral 162 designates an antenna conductor. A point of the embodiment different from the fifteenth embodiment resides in that conductor portions formed by thin plates of copper, copper alloy or iron alloy comprising the antenna conductor 162, the ground lines 159 and 160 and the feed line 161 are formed by pieces separate from the ground conductor 156.

Figure 30A:
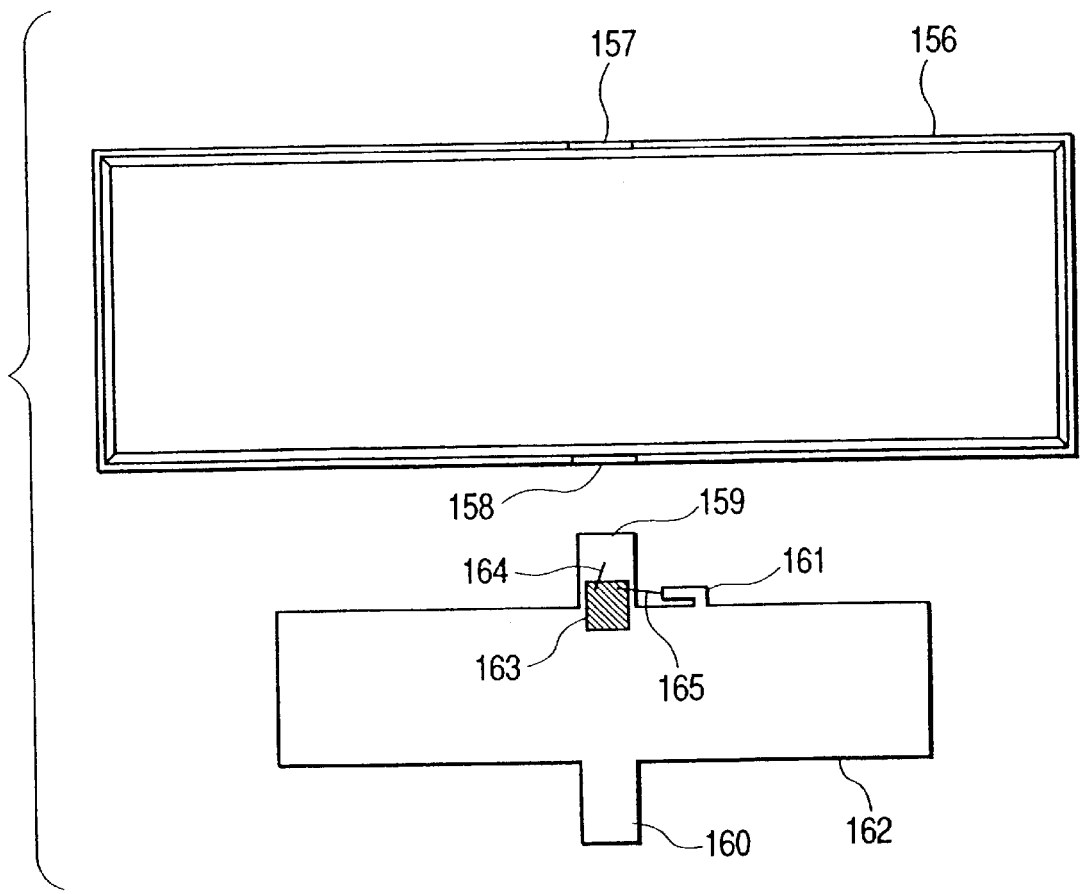
FIG. 30A is a plane view for explaining a step of mounting IC for the wireless tag according to the twenty-second embodiment.
Figure 30B:
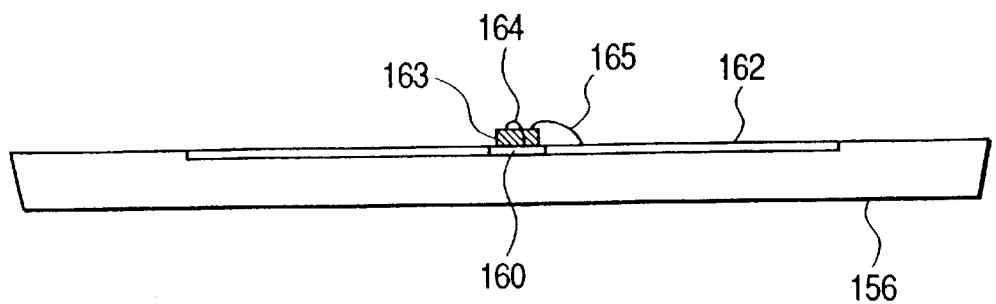
FIG. 30B is a side view for explaining the step of mounting IC for the wireless tag according to the twenty-second embodiment.

FIGS. 30A and 30B are drawings showing a mounting step successive to the mounting step shown by FIGS. 27A and 27B of the wireless tag constituted by the microstrip-line, FIG. 30A is a plane view thereof and FIG. 30B is a side view thereof. An element which operates in a fashion similar to that shown in FIGS. 29A and 29B the same numerical designation. In FIGS. 30A and 30B, numeral 163 designates IC and numerals 164 and 165 designate bonding wires. The IC 163 of the wireless tag is mechanically or mechanically and electrically connected to fixed to a portion of connecting the antenna conductor 162 and the ground line 159 by an adhering agent or a conductive adhering agent and connected thereto at a position as proximate as possible to a portion of fitting to the ground conductor 156 on the ground line 159 to ground the IC 163 by the bonding wire 164. A signal input/output portion of IC is connected to an open end portion of the feed line 161 by the bonding wire 165.

Figure 31A:
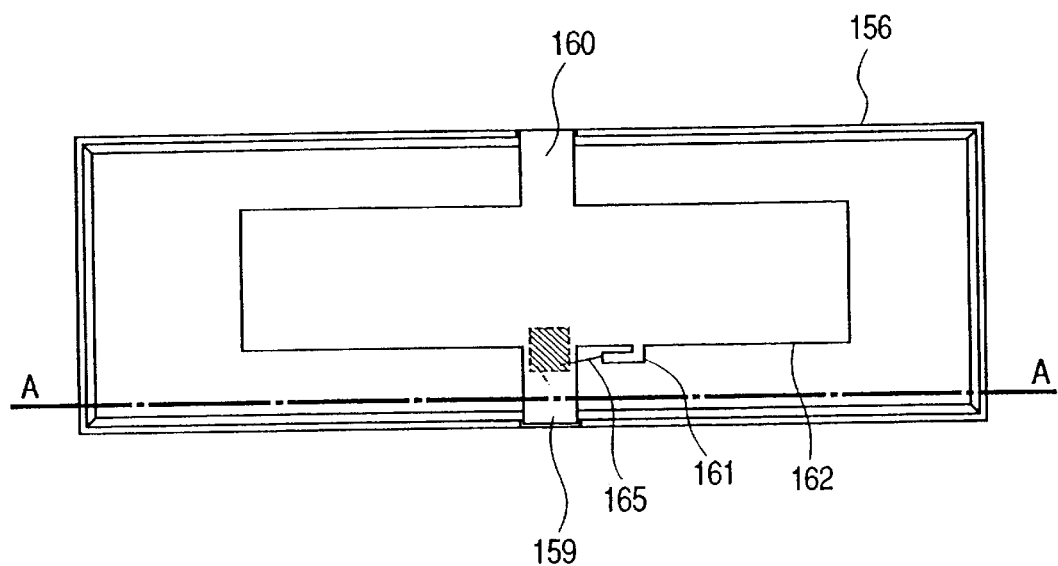
FIG. 31A is a plane view for the wireless tag according to the twenty-second embodiment.
Figure 31B:
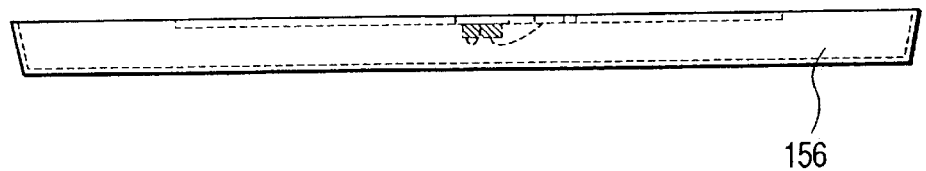
FIG. 31B is a side view of a section for the wireless tag according to the twenty-second embodiment.

A constitution showing a mounting operation of a successive stage is shown by a plane view of FIG. 31A and FIG. 31B constituting a side view of a section taken along a line A—A of FIG. 31A. In FIGS. 31A and 31B, an element which operates in a fashion similar to that shown in FIGS. 30A and 30B has the same numerical designation. In reference to the plane view of FIG. 31A, the antenna conductor 162 mounted with IC 163 of FIGS. 30A and 30B is turned upside down and open ends of the ground lines 158 and 159 and the fitting portions 158 and 157 are electrically and mechanically connected by press fitting, welding, soldering or the like. As a result, the antenna conductor 162 arranged with the IC 163 and the bonding wires 164 and 165 is attached to an opening portion of the ground conductor 156 such that the IC 163 is arranged on the inner side of the container. The dielectric member is air. An unstable structure is constituted by holding the antenna conductor 162 in a cantilever state and accordingly, mechanical strength and electrical stability are maintained by feeding a resin of a foaming agent near to air or introducing supporters comprising a dielectric member as shown by FIGS. 25A and 25B and FIGS. 26A and 26B. Protection of the IC 163 and the bonding wires 164 and 165 are separately needed. By filling a resin mold material by transfermolding or resin filling to a cavity portion of the wireless tag of FIGS. 31A and 31B, a downsized wireless tag can be realized by the effect of wavelength shortening and at the same time, the IC 163 or the bonding wires 164 and 165 can be protected.

Figure 32A:
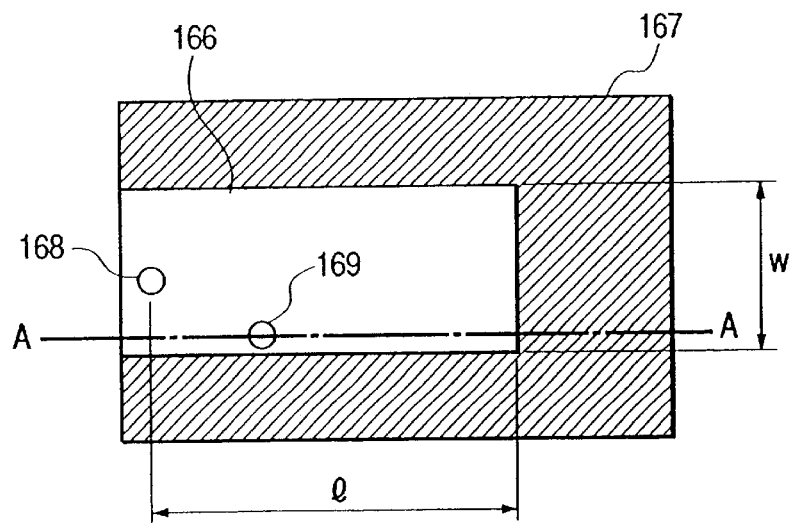
FIG. 32A is a plane view of a quarter-wavelength antenna for a wireless tag according to a twenty-third embodiment.
Figure 32B:
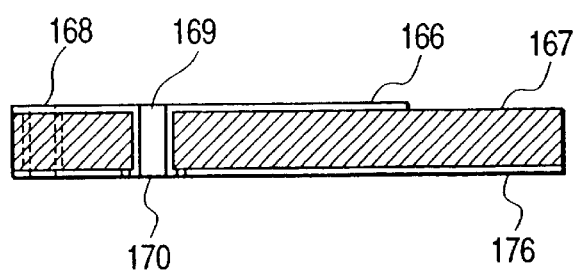
FIG. 32B is a side view of the quarter-wavelength antenna for the wireless tag according to the twenty-third embodiment.
Figure 32C:
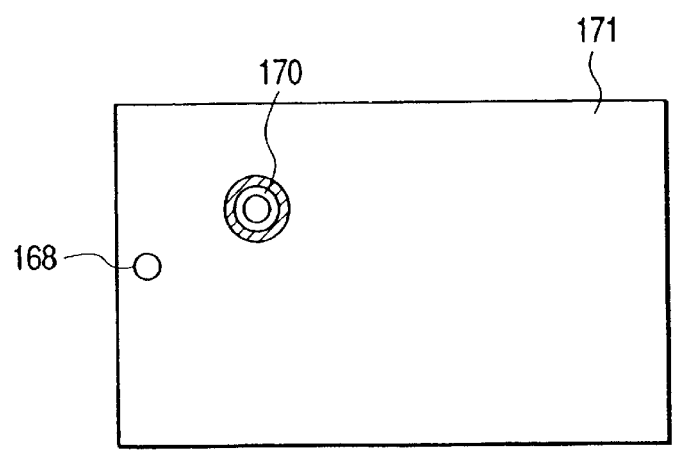
FIG. 32C is a plane view of a rear face of the quarter-wavelength antenna for the wireless tag according to the twenty-third embodiment.

FIGS. 32A, 32B and 32C are drawings showing an antenna of a wireless tag showing a twenty-third embodiment of the present invention in which FIG. 32A is a plane view thereof, FIG. 32B is a side view showing a section taken along a line A—A of FIG. 32A and FIG. 32C is a plane view of a rear face thereof. In FIGS. 32A, 32B and 32C, numeral 166 designates an antenna conductor, numeral 167 designates a dielectric member, numeral 168 designates a through hole, numeral 169 designates a feed point, numeral 170 designates an input/output terminal of signal and numeral 171 designates a ground conductor. A quarter wavelength type antenna conductor 166 operates as an antenna constituted by a quarter wavelength—type microstrip-line opening multiple ends one end of which is grounded to the ground conductor 171 of the rear face by the through hole 168. The antenna 166 constitutes a microstrip-line constituted by the dielectric member and the ground conductor 171. The feed point 169 is connected to the signal input/output terminal of the rear face via the through hole. The signal input/output terminal is connected to an IC including a rectenna circuit. The antenna conductor 166 is provided with a length "l" having a length in correspondence with substantially a quarter wavelength and is resonated at a corresponding frequency. A width "w" of the antenna conductor 166 is determined in consideration of the efficiency of the antenna and matching with the IC circuit.

Figure 33A:
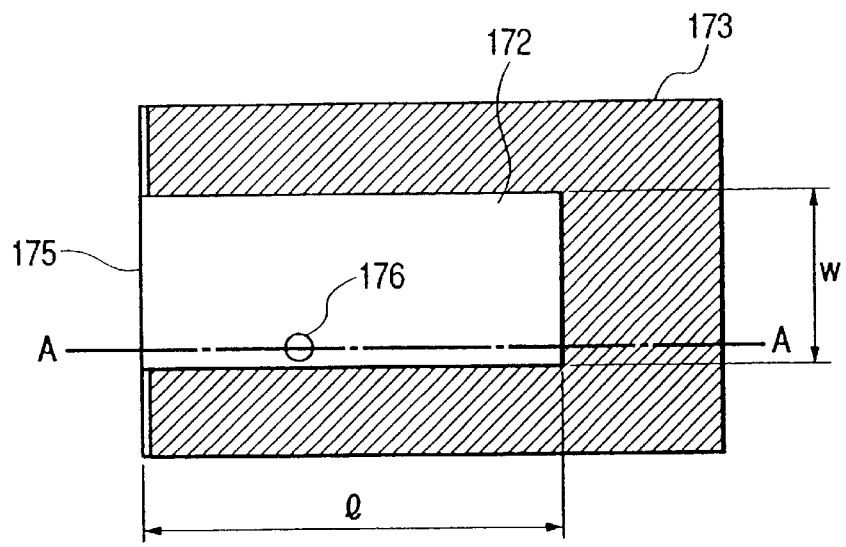
FIG. 33A is a plane view of a quarter-wavelength antenna for a wireless tag according to a twenty-fourth embodiment.
Figure 33B:
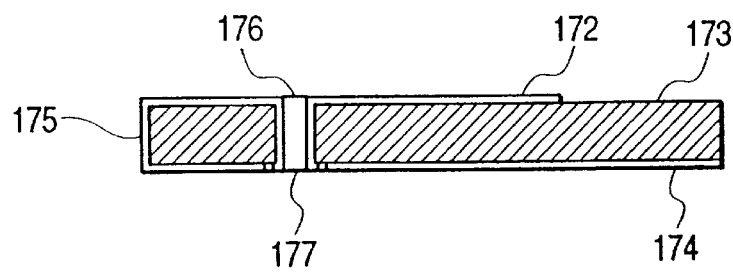
FIG. 33B is a side view of the quarter-wavelength antenna for the wireless tag according to the twenty-fourth embodiment.
Figure 33C:
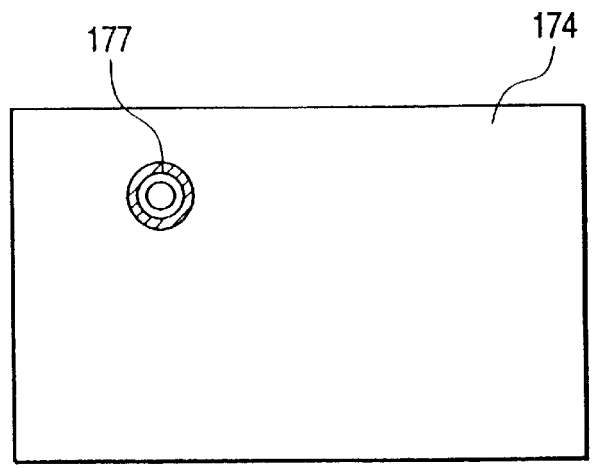
FIG. 33C is a plane view of a rear face of the quarter-wavelength antenna for the wireless tag according to the twenty-fourth embodiment.

FIGS. 33A, 33B and 33C are drawings showing an antenna of a quarter wavelength microstrip-line type showing a twenty-fourth embodiment of the present invention in which FIG. 33A is a plane view thereof. FIG. 33B is a side view showing a section taken along a line A—A of FIG. 33A and FIG. 33C is a plane view of a rear face thereof In FIGS. 33A, 33B and 33C, numeral 172 designates an antenna conductor, numeral 173 designates a dielectric member, numeral 174 designates a ground conductor, numeral 175 designates an earth line, numeral 176 designates a feed point and numeral 177 designates a signal input/output terminal. A point of the embodiment different from the embodiment of FIGS. 32A, 32B and 32C resides in that the ground side of the antenna conductor 172 is electrically connected to the ground conductor 174 of the rear face by the ground line 175.

Figure 34A:
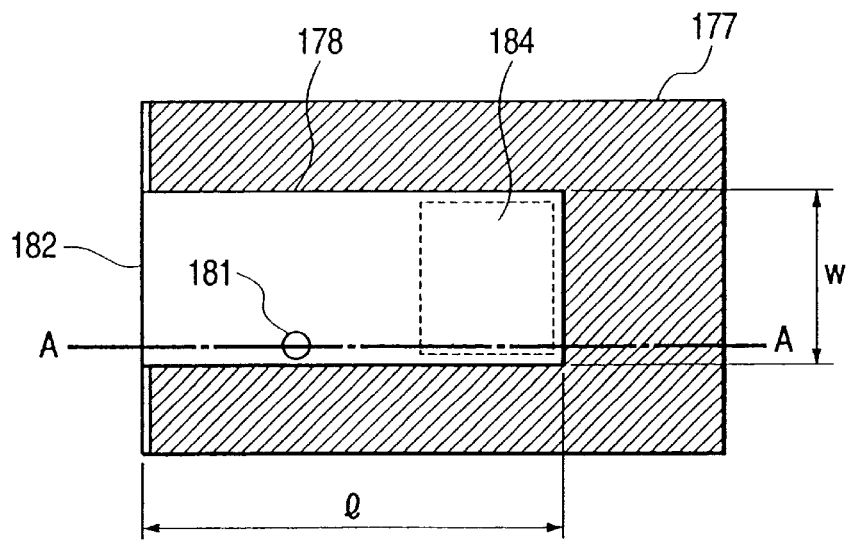
FIG. 34A is a plane view of a quarter-wavelength antenna for a wireless tag according to a twenty-fifth embodiment.
Figure 34B:
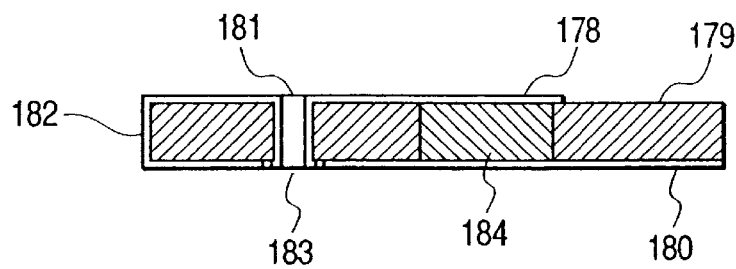
FIG. 34B is a side view of the quarter-wavelength antenna for the wireless tag according to the twenty-fifth embodiment.
Figure 34C:
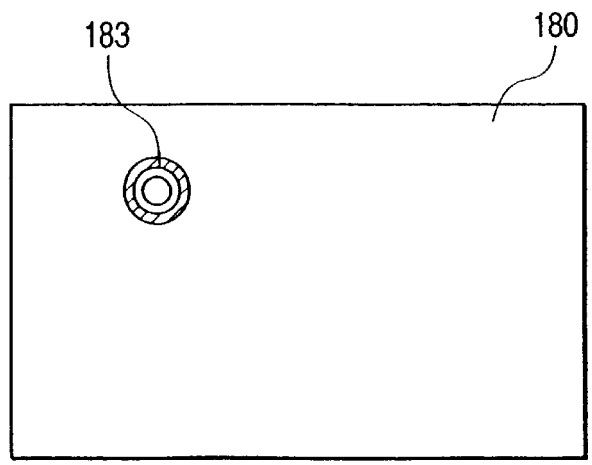
FIG. 34C is a plane view of a rear face of the quarter-wavelength antenna for the wireless tag according to the twenty-fifth embodiment.

FIGS. 34A. 34B and 34C show a twenty-fifth embodiment of the present invention and concerns a constitution in which a portion of the dielectric member in FIGS. 33A, 33B and 33C is replaced by other dielectric member and other dielectric member having a pertinent material can be selected in accordance with a resonance frequency of the antenna, a matching state and price of the dielectric member material. In FIGS. 34A, 34B and 34C, numeral 178 designates an antenna conductor, numeral 179 designates a dielectric member, numeral 180 designates a ground conductor, numeral 181 designates a feed point, numeral 182 designates a ground line and numeral 183 designates a signal input/output terminal. The IC of a wireless tag can be connected to the rear face via a signal input/output terminal of the rear face.

Figure 35A:
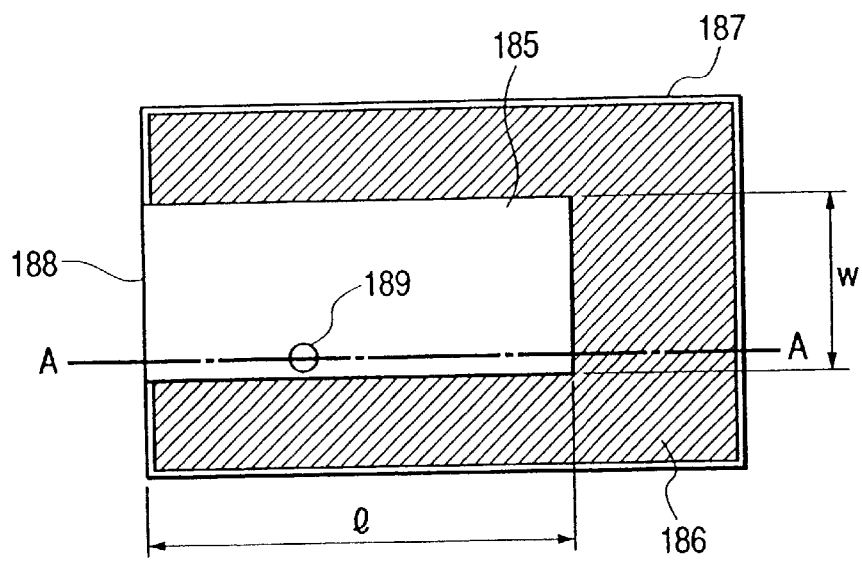
FIG. 35A is a plane view of a quarter-wavelength antenna for a wireless tag according to a twenty-sixth embodiment.
Figure 35B:
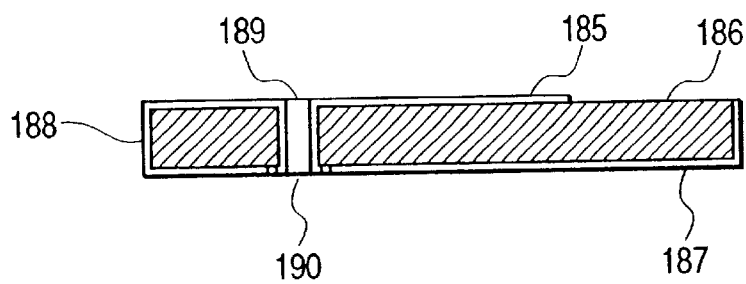
FIG. 35B is a side view of the quarter-wavelength antenna for the wireless tag according to the twenty-sixth embodiment.
Figure 35C:
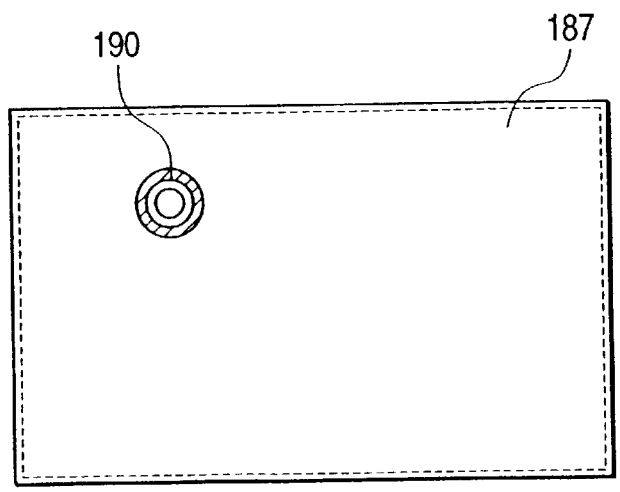
FIG. 35C is a plane view of a rear face of the quarter-wavelength antenna for the wireless tag according to the twenty-sixth embodiment.

FIGS. 35A, 35B and 35C are drawings showing a quarter-wavelength antenna for a wireless tag by a microstrip-line showing a twenty-sixth embodiment of the present invention. FIG. 35A is a plane view thereof, FIG. 35B is a side view showing a section taken along a line A—A of FIG. 35A and FIG. 35C is a plane view of a rear face thereof. In FIGS. 35A, 35B and 35C, numeral 185 designates an antenna conductor, numeral 186 designates a dielectric member, numeral 187 designates a ground conductor, numeral 188 designates a ground line, numeral 189 designates a feed point and numeral 190 designates a signal input/output terminal. A point of the embodiment different from the embodiment of FIGS. 34A, 34B and 34C resides in that the ground conductor 187 covers end faces of the dielectric member 186. With regard to covering of the ground conductor 187 up to the end faces of the conductor, as described in the example of the antenna of the half wavelength type in the example of FIGS. 14A, 14B and 14C, when the plate thickness of the dielectric member 187 is thin, the ground conductor covering the end face portions does not effect influence of changing the ground point of the antenna; however, when the plate thickness of the dielectric member 187 is thick, in the case in which the wireless tags are arranged to be proximate to each other, there is achieved an effect of improving against a change in the radiation characteristic of the antenna by changing the impedance between the wireless tags at high frequencies.

Figure 36A:
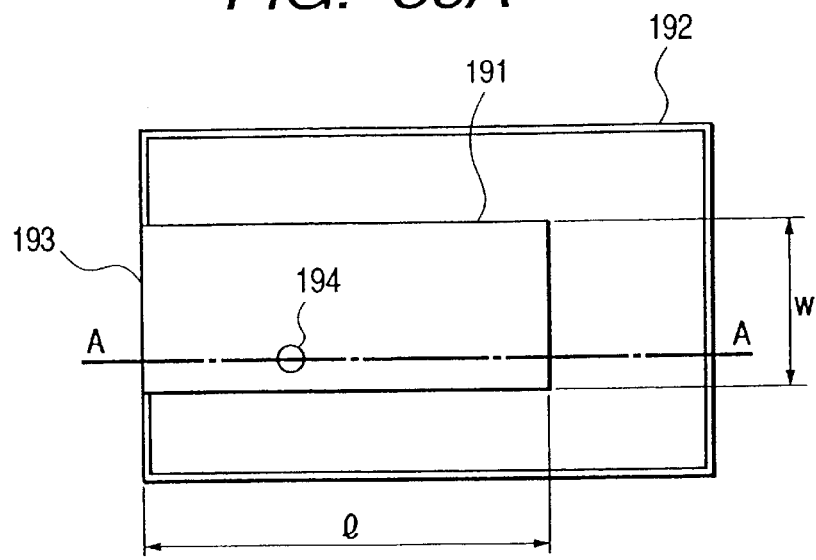
FIG. 36A is a plane view of a quarter-wavelength antenna for a wireless tag according to a twenty-seventh embodiment.
Figure 36B:
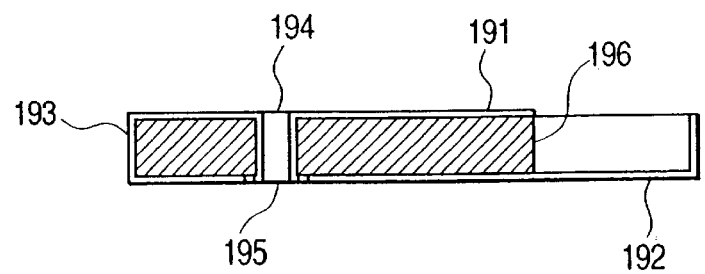
FIG. 36B is a side view of the quarter-wavelength antenna for the wireless tag according to the twenty-seventh embodiment.
Figure 36C:
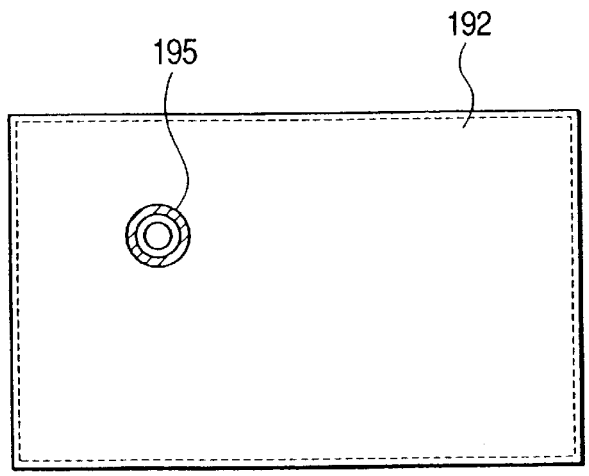
FIG. 36C is a plane view of a rear face of the quarter-wavelength antenna for the wireless tag according to the twenty-seventh embodiment.

FIGS. 36A, 36B and 36C show a twenty-seventh embodiment of the present invention, showing a constitution of a quarter-wavelength antenna having a microstrip-line constitution. FIG. 36A is a plane view thereof, FIG. 36B is a side view showing a section taken along a line A—A of FIG. 36A and FIG. 36C is a plane view of a rear face thereof. In FIGS. 36A, 36B and 36C, numeral 191 designates an antenna conductor, numeral 192 designates a ground conductor, numeral 193 designates line, numeral 194 designates a feed point, numeral 195 designates a signal input/output terminal and numeral 196 designates a dielectric member. A point of the embodiment different from the embodiment of FIGS. 35A, 35B and 35C resides in that the dielectric member 196 is arranged to be restricted to only between the lower side of the antenna conductor and the ground conductor. This is a constitution effective in the case in which an expensive material is introduced as the material of the dielectric member 196.

Figure 37A:
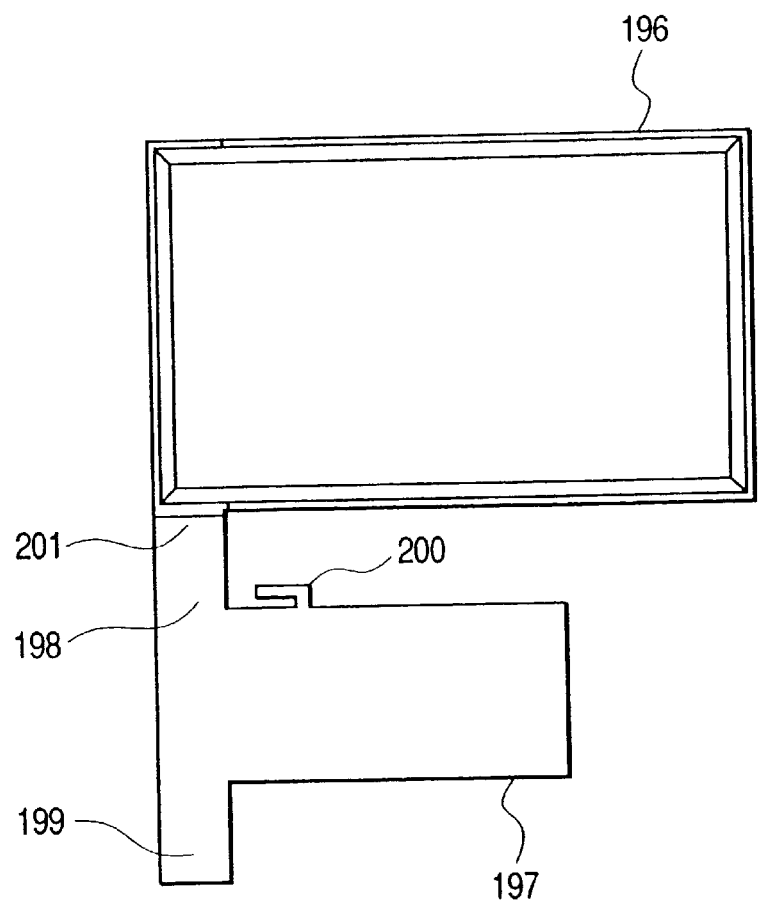
FIG. 37A is a plane view of a conductor of a quarter wavelength type wireless tag according to a twenty-eighth embodiment.
Figure 37B:
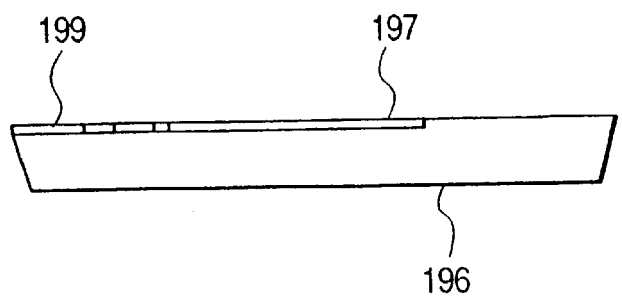
FIG. 37B is a side view of the conductor of the quarter wavelength type wireless tag according to the twenty-eighth embodiment.
Figure 38A:
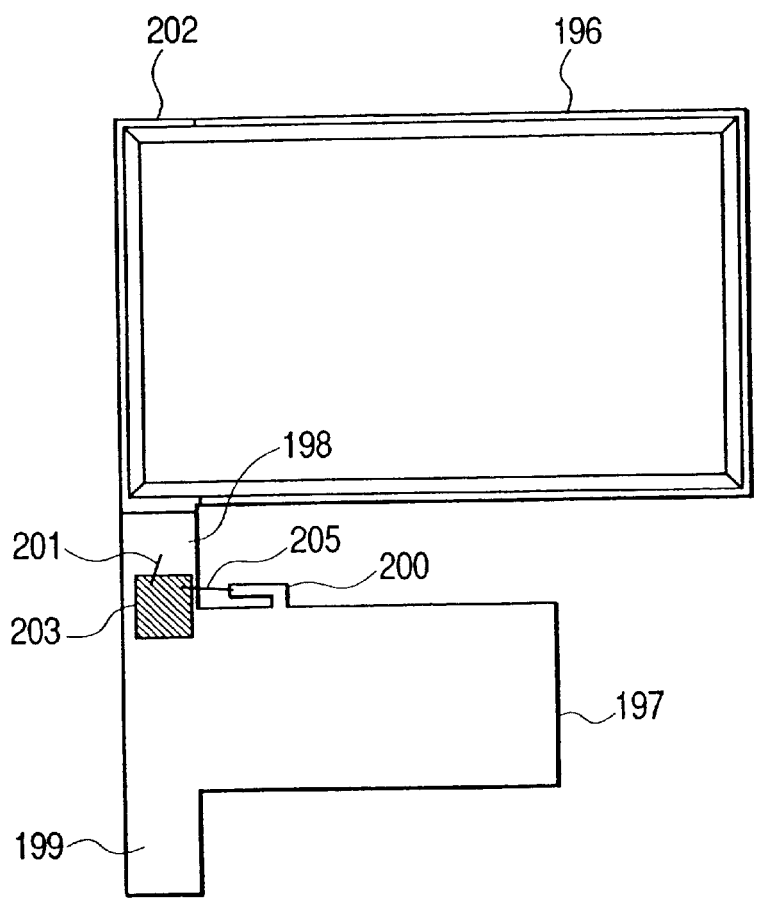
FIG. 38A is a plant-view for explaining an IC mounting step of the quarter wavelength type wireless tag according to the twenty-eighth embodiment.
Figure 38B:
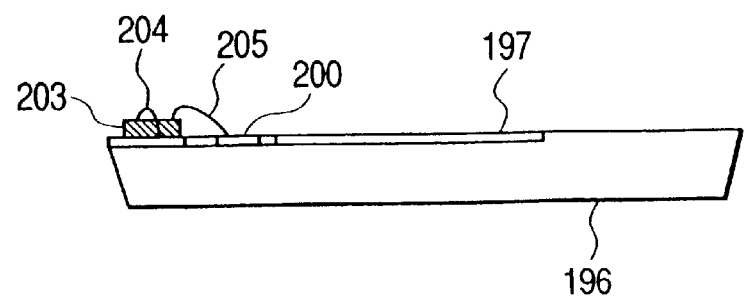
FIG. 38B is a side view for explaining the IC mounting step of the quarter wavelength type wireless tag according to the twenty-eighth embodiment.
Figure 39A:
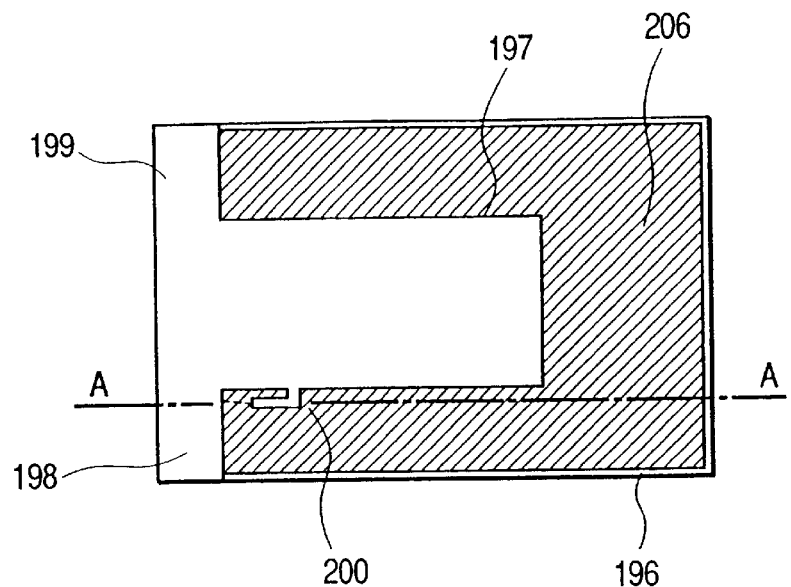
FIG. 39A is a plane view of the quarter wavelength type wireless tag according to the twenty-eighth embodiment.
Figure 39B:
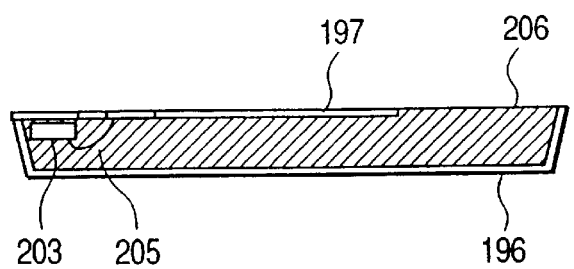
FIG. 39B is a side view of the quarter wavelength type wireless tag according to the twenty-eighth embodiment.
Figure 39C:
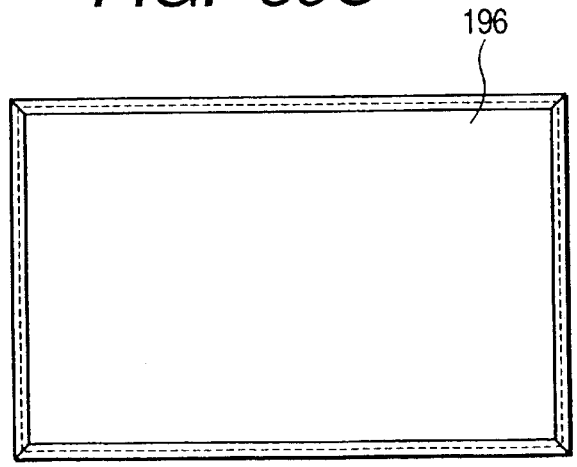
FIG. 39C is a plane view of a rear face of the quarter wavelength type wireless tag according to the twenty eighth embodiment.

FIGS. 37A, 37B, FIGS. 38A, 38B, FIGS. 39A, 39B, 39C are drawings of a twenty-eighth embodiment of the present invention showing a method of mounting a wireless tag using a quarter wavelength type antenna utilizing a microstripline. First, FIGS. 37A and 37B are drawings showing a behavior of integrally forming an antenna conductor and a ground conductor for mounting an IC of a wireless tag by pressing thin plates of copper, copper alloy or iron alloy in which FIG. 37A is a plane view thereof and FIG. 37B is a side view thereof. In FIGS. 37A and 37B, numeral 196 designates a ground conductor, numeral 197 designates an antenna conductor, numerals 198 and 199 designate ground lines, numeral 200 designates a feed line numeral 201 designates a valley-folding portion and numeral 202 designates a fitting portion. The ground conductor 196 forms a container one face of which is opened and which is provided with a space for filling the dielectric member. One end of the antenna conductor 197 on a side opposed to an open end thereof and portions of the ground lines 198 and 199 in contact with the ground conductor 196, are folded at the valley-folding portion and fitted at the fitting portion 202 at the same time, electrically and mechanically connected thereto by fitting, welding, soldering or the like. A successive step is shown by FIGS. 38A and 38B. FIGS. 38A and 38B show a step of mounting the IC for the wireless tag. FIG. 38A is a plane view and FIG. 38B is a sectional view of a side face thereof and an element which operates in a fashion similar to that shown in FIGS. 37A and 37B has the same numerical designation. In FIGS. 38A and 38B, numeral 203 designates IC and numerals 204 and 205 designate bonding wires. The IC 203 is electrically or mechanically fixed to the antenna conductor by the bonding wires 204 and 205. With regard to ground point and a signal input portion of the IC 203, by the bonding wires 204 and 205, the ground point is connected to a point as proximate as possible to the earth conductor 196 and the signal input/output portion is connected to an open end portion of the feed line 200 to thereby complete a circuit portion of the wireless tag. Next, at a step shown by FIGS. 39A, 39B and 39C, a dielectric member material constituting a dielectric member having a microstrip constitution is filled. FIG. 39A is a plane view after filling a resin mold material by transfermolding or mold material injection, FIG. 39B is a side view showing a section taken along a line A—A of FIG. 39A, FIG. 39C is a plane view of a rear face thereof and the dielectric member material is filled from an opening portion of FIGS. 38A and 38B to between the antenna conductor 197 and the earth conductor 196 such that an interval therebetween becomes uniform. An element which operates in a fashion similar to that shown in FIGS. 38A and 38B has the same numerical designation. In FIGS. 39A, 39B and 39C, numeral 206 designates the dielectric member.

Figure 40A:
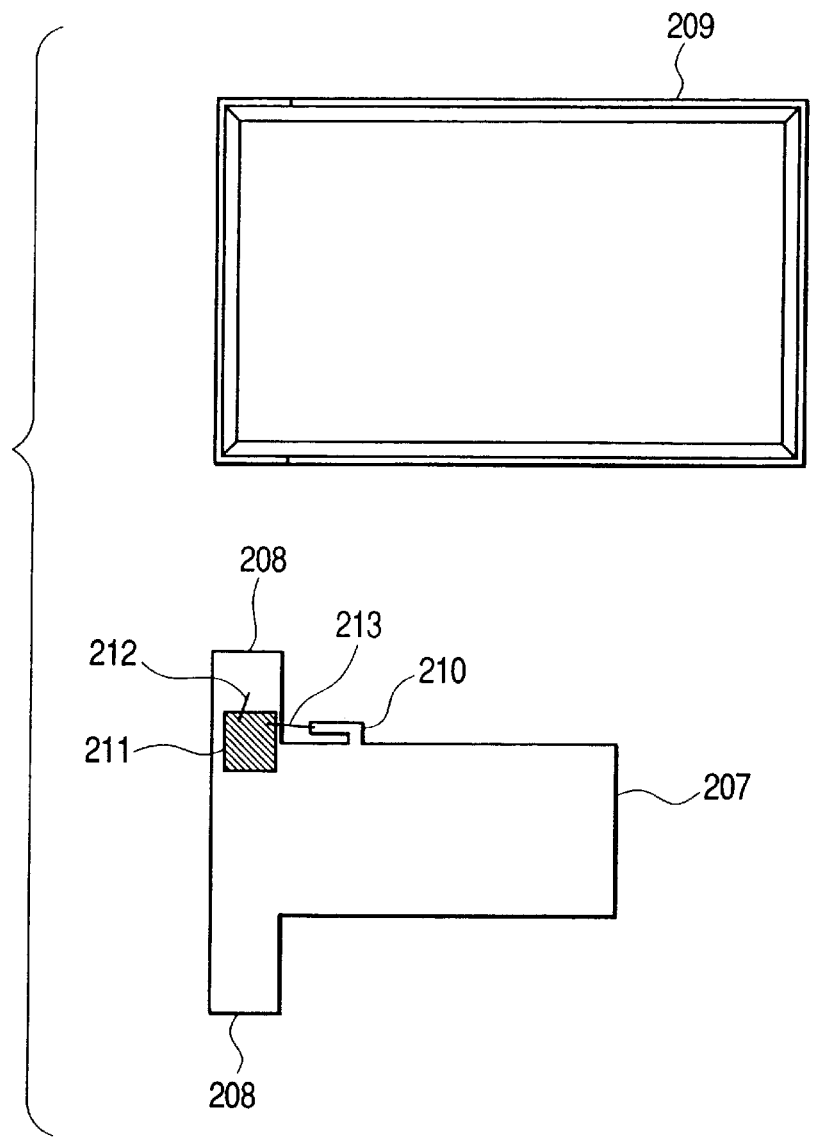
FIG. 40A is a plane view for explaining a conductor and IC of a quarter wavelength type wireless tag according to a twenty-ninth embodiment.
Figure 40B:
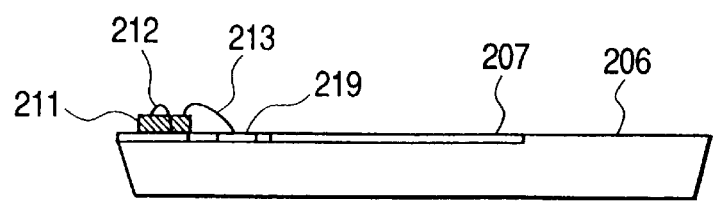
FIG. 40B is a side view for explaining the conductor and the IC of the quarter wavelength type wireless tag according to the twenty ninth embodiment.

FIGS. 40A and 40B show a mounting step of a wireless tag of a quarter wavelength type constituted by a microstripline according to a twenty-ninth embodiment of the present invention. FIG. 40A is a plane view thereof and FIG. 40B is a side view thereof. A point of the embodiment different from the embodiment of FIG. 38A and FIG. 38B resides in that an antenna conductor is separated from a ground conductor. In FIGS. 40A and 40B, numeral 207 designates an antenna conductor, numerals 208a and 208b designate ground lines, numeral 209 designates a ground conductor, numeral 210 designates a feed line, numeral 211 designates an IC and numerals 212 and 213 designate bonding wires. The antenna conductor 207 and the ground conductor 209 can be formed separately and the IC 211 can be mounted to the antenna conductor 207 and the manufacturing steps can be constituted by light-weighted formation. Next, the dielectric member is filled by steps the same as the steps shown in FIGS. 39A, 39B and 39C. The antenna conductor 207 in a cantilever constitution is reinforced by using dielectric member supporters in air to thereby mount the wireless tag.

Figure 41:
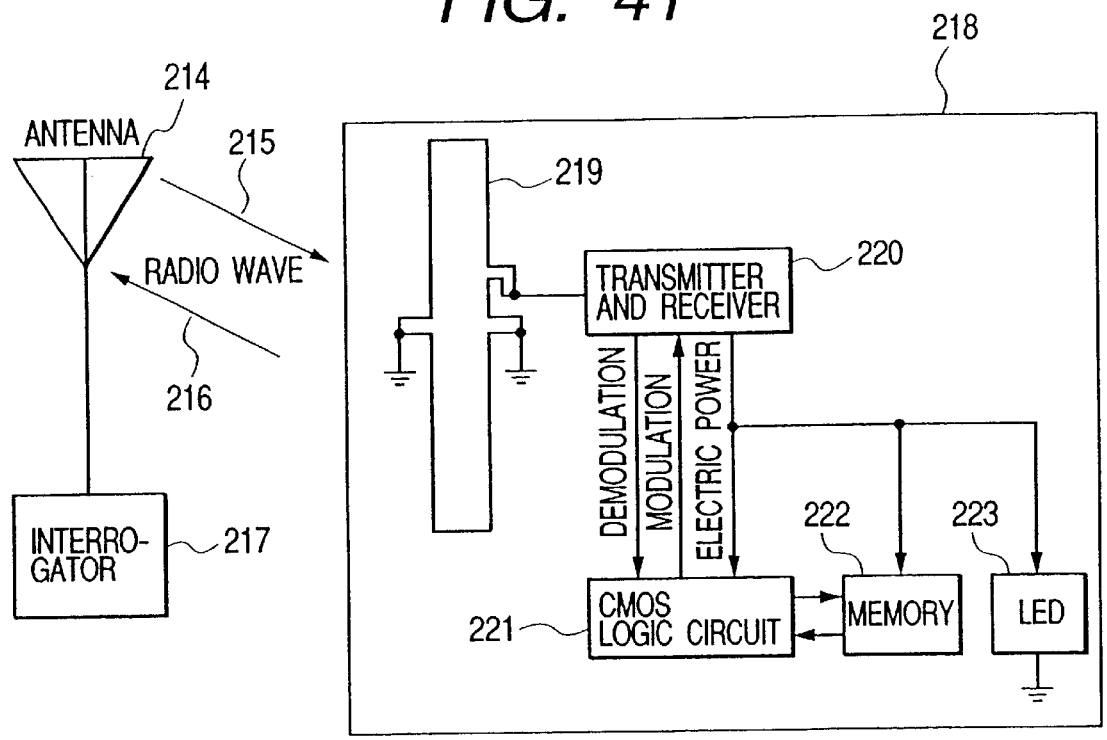
FIG. 41 is a block diagram for explaining a constant voltage forming system of a wireless tag according to a thirteenth embodiment.

FIG. 41 shows a block diagram of a wireless tag system showing a thirtieth embodiment of the wireless tag according to the present invention. In FIG. 41, numeral 214 designates an interrogator antenna, numeral 215 designates an input signal, numeral 216 designates an output signal, numeral 217 designates an interrogator, numeral 218 designates a wireless tag, numeral 219 designates an antenna, numeral 220 designates a transmitter and receiver, numeral 221 designates a CMOS logic circuit, numeral 222 designates a memory and numeral 223 designates an LED. Upon receiving a signal from the interrogator 217, in the transmitter and receiver, the signal is rectified, power of operating the CMOS logic circuit 221 or the memory 222 is produced, at the same time, a clock signal or a data signal for operating the CMOS logic circuit 221 is generated from the received signal 215 by detection. When a distance between the interrogator antenna 214 and the antenna 219 of the wireless tag is small, there poses a problem in which voltage of a power source formed by the transmitter and the receiver becomes high and exceeds withstand voltage of the CMOS logic circuit or the memory circuit. In order to deal therewith, the LED 223 is connected to a power end of the transmitter and receiver 220 in the forward direction such that current flows between the LED 223 and ground. In this case, when the LED 223 is supplied with a voltage of 1.5 to 2 volts or higher, power can be dissipated by a light emitting phenomenon, the CMOS logic circuit 221 or the memory 222 can be prevented from being supplied with extra high voltage and at the same time, light can be emitted from the LED.

Figure 42:
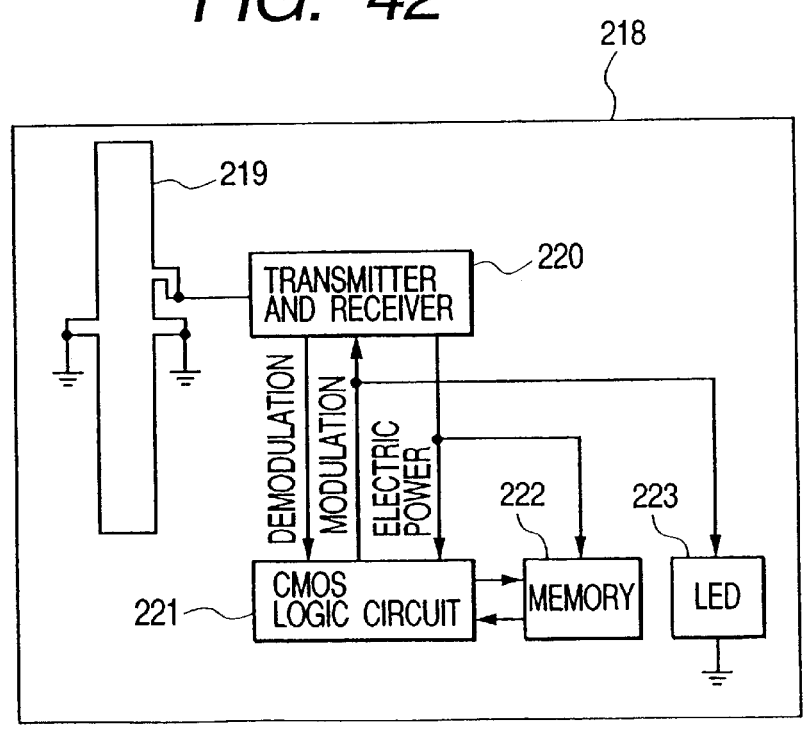
FIG. 42 is a block diagram for explaining a constant voltage forming system of a wireless tag according to a thirty-first embodiment.

FIG. 42 is a block diagram of a wireless tag showing a thirty-first embodiment of the present invention. In FIG. 42, an element which operates in a fashion similar to that shown in FIG. 41 has the same numerical designation. The LED 223 is driven by a signal outputted from the CMOS logic circuit and constituting a modulated signal of the transmitter and receiver. A voltage substantially power is outputted as output voltage of the CMOS logic circuit and is provided with a capability of driving LED 223. By driving the LED 223 by the modulated signal of the CMOS logic circuit, the signal is optically modulated by LED 223 and the signal from the wireless tag can utilize a transmission system using light.

Figure 43:
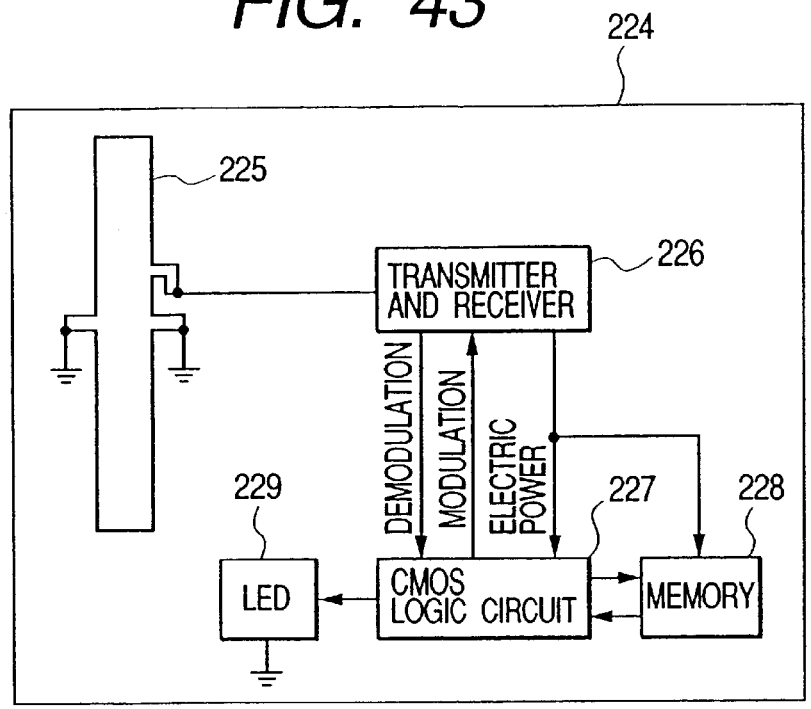
FIG. 43 is a block diagram for explaining a light emitting signal generating system of a wireless tag according to a thirty-second embodiment.

FIG. 43 is a block diagram showing a thirty-second embodiment of the present invention, numeral 224 designates a wireless tag, numeral 225 designates an antenna, numeral 226 designates a transmitter and receiver, numeral 227 designates a CMOS logic circuit, numeral 228 designates a memory and numeral 229 designates an LED. By constituting the LED 229 such that light emission thereof is controlled by the signal from the CMOS logic circuit 227, the light emitting phenomenon can be controlled from the interrogator.

Figure 44:
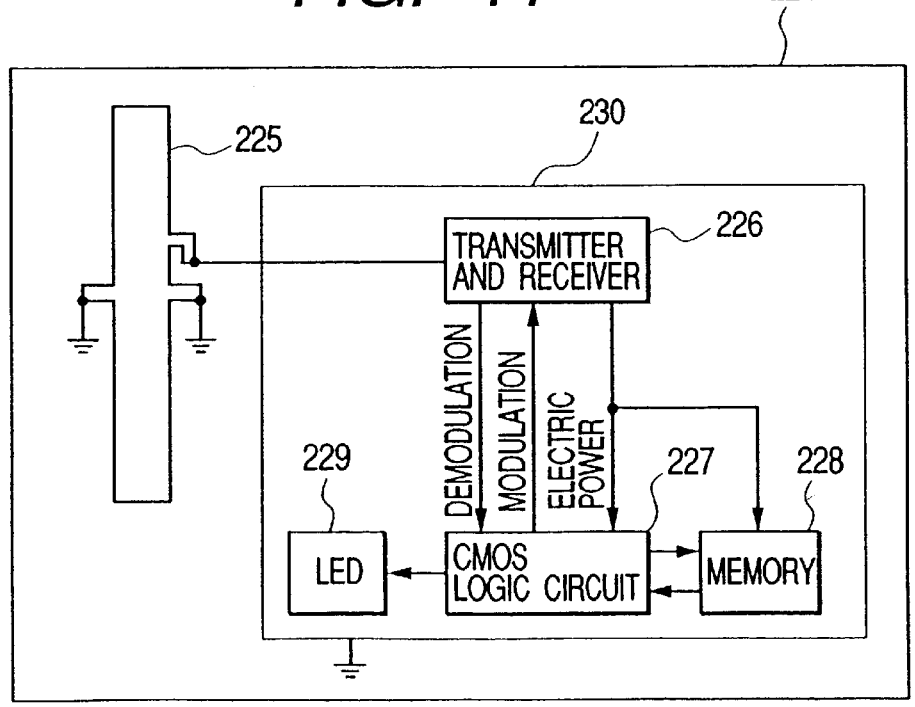
FIG. 44 is a block diagram for explaining an IC constitution of a wireless tag according to a thirty-third embodiment.

FIG. 44 shows a thirty-third embodiment of the present invention. An element of the embodiment which operates in a fashion similar to that shown in the embodiment of FIG. 43 has the same numerical designation. In FIG. 44, numeral 230 designates an IC. The IC 230 is constituted by a single chip constitution integrated with the transmitter and receiver 226 comprising shottky barrier diodes, the CMOS logic circuit 227, the memory 228 and the LED 229.

Figure 45A:
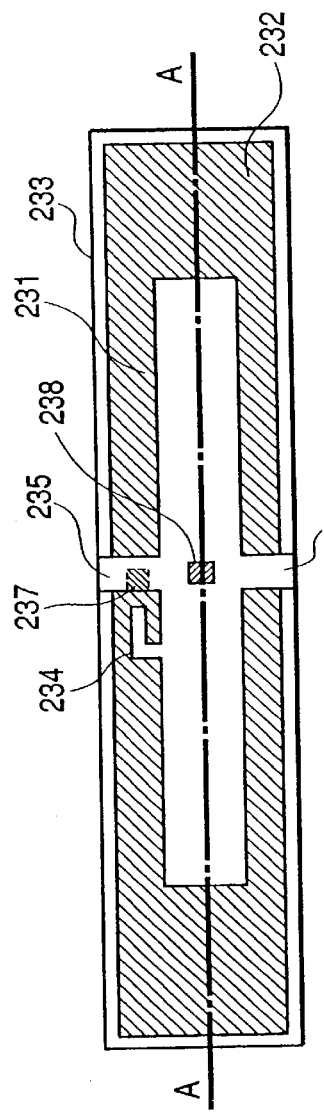
FIG. 45A is a plane view of a constant voltage type/light emitting type wireless tag according to a thirty-fourth embodiment.
Figure 45B:
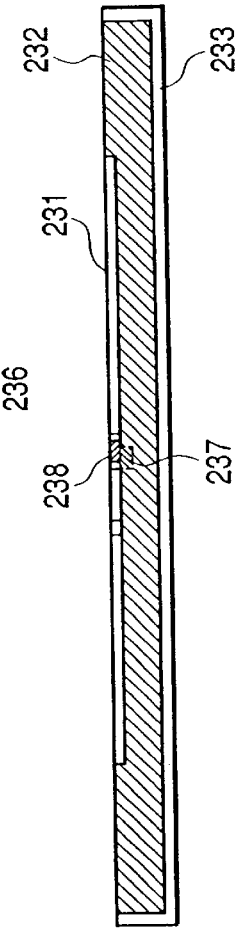
FIG. 45B is a side view of the constant voltage type/light emitting type wireless tag according to the thirty-fourth embodiment.

FIGS. 45A and 45B are drawings showing a wireless tag of a microwave line constitution showing a thirty-third embodiment of the present invention in which FIG. 45A is a plane view thereof, and FIG. 45B is a side view showing a section taken along a line A—A of FIG. 45A. In FIGS. 45A and 45B, numeral 231 designates an antenna conductor, numeral 232 designates a dielectric member, numeral 233 designates a ground conductor; numeral 234 designates a feed line, numerals 235 and 236 designate ground lines, numeral 237 designates an IC and numeral 238 designates an LED. The LED 238 is fabricated by perforating a hole capable of confirming light emission thereof at a central portion in the longitudinal direction and the width direction which is a low potential point of the antenna conductor 231 and is mounted from the rear face of the antenna conductor 231.

Figure 46A:
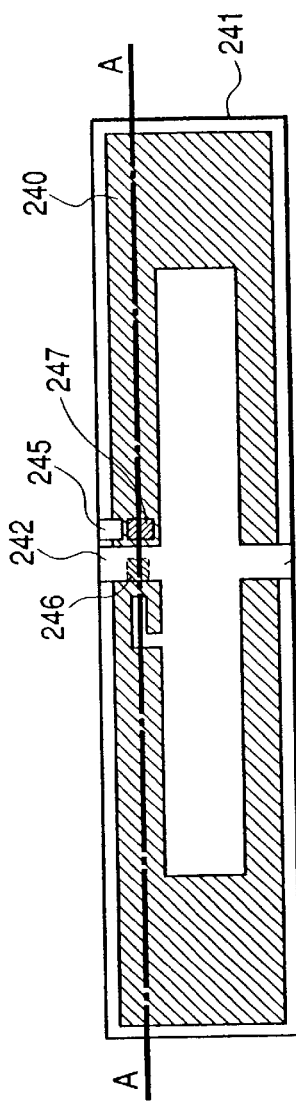
FIG. 46A is a plane view of a constant voltage type/light emitting type wireless tag according to a thirty-fifth embodiment.
Figure 46B:
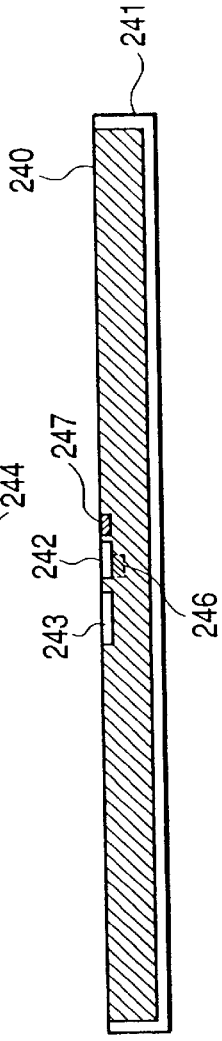
FIG. 46B is a side view of the constant voltage type/light emitting type wireless tag according to the thirty-fifth embodiment.

FIGS. 46A and 46B are drawings showing a wireless tag having a microstrip-line constitution showing a thirty-fourth embodiment of the present invention in which FIG. 46A is a plane view thereof and FIG. 46B is a side view of a section taken along a line A—A of FIG. 45A. In FIGS. 46A and 46B, numeral 239 designate an antenna conductor, numeral 240 designates a dielectric member, numeral 241 designates a ground conductor, numerals 242 and 244 designate ground lines, numeral 243 designates a feed line, numeral 245 designates an LED attaching terminal, numeral 246 designates an IC and numeral 247 designates an LED. The cathode of the LED 247 is electrically connected to a point of the antenna conductor 239 in a position proximate to the IC 246 of the antenna 239 and the anode is electrically and mechanically connected to the LED attaching terminal 245 having no electrical potential. The LED attaching terminal is electrically connected to the IC 246 by wirings such as bonding wires for receiving a supply of power from the IC 246. FIGS. 47A and 47B show a situation of attaching the LED 247 in further detail.

FIGS. 47A and 47B show an enlargement of the area surrounding the LED 247 of the antenna conductor 239 in FIGS. 46A and 46B formed by using thin plates of copper, copper alloy, iron alloy or the like by press forming or the like in which FIG. 47A is a plane view thereof and FIG. 47B is a side view showing a section taken along a line A—A of FIG. 47A. In FIGS. 47A and 47B, numeral 248 designates a frame, numeral 249 designates a ground line, numeral 250 designates an LED attaching terminal, numeral 251 designates a feed line, numeral 252 designates an antenna conductor, numeral 253 designates an IC, numeral 254 designates an LED, numerals 255 and 256 designate solder and numerals 258 and 259 designate bonding wires. The anode of the LED 254 is electrically and mechanically connected to the LED attaching terminal 250 and the cathode of the LED is electrically and mechanically connected to the antenna conductor 252 respectively by the solders 256 and 254 and a signal of the IC 253 for controlling the light emission of the LED is supplied by connecting the IC 253 and the LED attaching terminal 250 by the bonding wire 259 arranged therebetween. After finishing attaching constituent elements such as the LED 254, the antenna conductor 252 and the like and after finishing filling the dielectric member 240 in FIGS. 46A and 46B, by separating the frame 248 at a broken line portion of B—B in FIGS. 47A and 47B, the LED attaching terminal 250 constitutes an electrically independent terminal.

The following can be expected by the wireless tag and the antenna for the wireless tag according to the present invention.

(1) By grounding a middle point of a resonator of a style of a half wavelength type microstrip-line by an impedance element for grounding such as a through hole or a microstrip-line, an antenna constitutes a double tuned circuit comprising quarter wavelength type antennas coupled at high frequencies by the grounding impedance element, and a matching frequency band at high frequencies can be widened more than an antenna of a single resonating mechanism and accordingly, means for avoiding interference from other apparatus used in the same frequency band by switching frequencies transmitted from an interrogator, can easily be introduced without preparing other apparatus in which a frequency band of an antenna of a wireless tag is changed. Further, by changing the magnitude of ground impedance, a frequency band of a matching frequency band at high frequencies can be changed.

(2) With regard to grounding of a middle point of a half wavelength type microstrip-line, by changing widths of lengths of microstrip-lines of respective quarter wavelength type antennas, there can be constituted an antenna resonated by different resonating characteristics at two different frequencies.

(3) There can be adopted a constitution in which a middle point of a half wavelength type antenna is connected to a ground conductor of a microstrip-line by a ground line or a through hole and accordingly, an antenna conductor and a ground conductor can be integrated by connecting and coupling them electrically and mechanically and accordingly, the antenna conductor and the ground conductor can be formed integrally from the same metal plate. Further, despite the fact that the antenna conductor is formed by one sheet of continuous metal plate, at high frequencies, a potential point having a signal potential different from ground potential can be set on a single sheet of the conductor plate. Therefore, an IC or a plurality of ICs which need to connect to a plurality of potential points at high frequencies, can easily be mounted to the integrated conductor by means of wire bonding or the like with no need of a complicated shape on the monolithic antenna conductor or the monolithic conductor integral with the antenna conductor and the ground conductor. Therefore, there can be easily introduced packaging means such as transfermolding packaging IC mounted on a lead frame by a mold material.

(4) By manufacturing a wireless tag by a mold technology such as transfer mode, a reduction in price can be achieved more than in an antenna constitution using a dielectric member substrate both faces of which are covered with copper. Further, although in the case of introducing a dielectric member substrate, IC has been difficult to contain, by introducing the mold technology such as transfermolding, IC can be contained easily and IC can easily be built in the wireless tag. Further, even in the case of discrete parts where a circuit of a wireless tag is not constituted by IC formation, the discrete parts can be contained at inside of the wireless tag and accordingly, the wireless tag can be manufactured with no significant change in the structure of the wireless tag from trial production to mass production.

(5) By achieving constant voltage formation by utilizing a unidirectional characteristic of an LED such that power for driving a CMOS logic circuit or a memory produced by a rectenna circuit by approaching an interrogator antenna of a transmitter and receiver of a wireless tag is prevented from increasing and exceeding withstand voltage of the CMOS logic circuit or the memory circuit, extra power can be used as power for making the LED emit light. By making the LED attached with a luminous part at an antenna face of the wireless tag emit light, in the case in which wireless tags are dealt with in face to face, by irradiation of radio wave from an interrogator, an operating wireless tag can be confirmed by visual examination and therefore, by using the wireless tag in stocktaking of articles dealing with a number of wireless tags time sequentially, operation of stocktaking is facilitated. Further, by introducing means for controlling light emission of the LED by the CMOS logic circuit, response from the wireless tag to the interrogator can be dealt with by optical signal. Further, in the case of visual examination, by introducing a mechanism of winking set to respective specific operations, status check of the wireless tag or check by visual examination of operation can be carried out.

(6) Aggregation of a total of a transmitter and receiver including LED, a CMOS logic circuit, a memory circuit and a rectenna circuit to a single chip of IC seems to be considerably difficult in view of an IC manufacturing process. It is inexpensive to prepare a chip individually for at least only an LED and mount to mix with an IC constituting other circuit in a single chip.

(7) According to the antenna for a wireless tag or the wireless tag by a quarter wavelength type microstrip-line of the present invention, the antenna effectively functions as a small-sized antenna in the case in which an antenna shape (length) is enlarged when the specific inductive capacity of the dielectric member is reduced and proximate to that of air by an antenna by a half wavelength type microstrip-line. An amount of a reduction in transmitting/receiving power by an effective area as an antenna by shortening the length of the antenna can be compensated for since high function formation can be achieved by using air or a dielectric member near to air. It is further understood by those skilled in the art that the foregoing description is a preferred embodiment of the disclosed device and that various changes and modifications may be made in the invention without departing from the spirit and scope thereof.

What is claimed is:

1. A wireless tag comprising:

an antenna;

a logic circuit;

a memory circuit;

a transmitter and receiver for rectifying a signal from said antenna and supplying an electric power to the logic circuit and the memory circuit through an electric power line; and an LED, the LED being coupled between the electric power line and a around in the forward direction, wherein the LED prevents a voltage formed by the transmitter and receiver from exceeding a voltage limit of the logic circuit and the memory circuit when a distance between the antenna and a source of the signal is small.

2. The wireless tag according to claim 1, wherein the transmitter and receiver, the logic circuit and the memory circuit are constituted by a single chip.

3. The wireless tag according to claim 1, wherein the transmitter and receiver comprise a rectifying circuit, the rectifying circuit being coupled between the electric power line and a ground.

4. The wireless tag according to claim 1, wherein the LED dissipates the supply voltage by a light emission when a voltage between the electric power line and ground excesses a predetermined voltage.

5. The wireless tag according to claim 4, wherein the predetermined voltage is a withstand voltage of the logic circuit.

6. The wireless tag according to claim 1, further comprising:

a dielectric member;

a ground conductor;

wherein the dielectric member is disposed between the antenna and the ground conductor;

the middle point of the antenna is connected to the ground conductor;

the LED is arranged on a side of the antenna; and a side of the ground conductor is used as a contacting face to an article when the wireless tag is arranged to the article.

7. A wireless tag comprising:

an antenna;

a logic circuit;

a memory circuit; and a transmitter and receiver for rectifying a signal from said antenna and supplying an electric power to the logic circuit and the memory circuit;

an LED;

wherein said LED is driven by a modulated signal from the logic circuit and transmits an optically modulated signal to an interrogator.

8. A wireless tag comprising:

an antenna;

a logic circuit;

a memory circuit; and a transmitter and receiver for rectifying a signal from said antenna and supplying an electric power to the logic circuit and the memory circuit;

an LED;

wherein said LED is driven by a signal from the logic circuit and transmits an optically modulated signal to an interrogator.

* * * * *